(12) United States Patent
Ishigaki et al.

(10) Patent No.: US 7,999,390 B2
(45) Date of Patent: Aug. 16, 2011

(54) SEMICONDUCTOR INTEGRATED CIRCUIT

(75) Inventors: Takeshi Ishigaki, Tokyo (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 666 days.

(21) Appl. No.: 12/137,623

(22) Filed: Jun. 12, 2008

(65) Prior Publication Data
US 2008/0308945 A1 Dec. 18, 2008

(30) Foreign Application Priority Data
Jun. 15, 2007 (JP) .................................. 2007-158907

(51) Int. Cl.
*H01L 23/48* (2006.01)
(52) U.S. Cl. .................................. 257/774; 257/E23.141
(58) Field of Classification Search .................. 257/774, 257/E23.141
See application file for complete search history.

(56) References Cited

U.S. PATENT DOCUMENTS
7,242,094 B2  7/2007  Matsunaga et al.

FOREIGN PATENT DOCUMENTS
JP  8-130220  5/1996
JP  2004-63667  2/2004

*Primary Examiner* — Benjamin P Sandvik
*Assistant Examiner* — Krista Soderholm
(74) *Attorney, Agent, or Firm* — Sprinkle IP Law Group

(57) ABSTRACT

A semiconductor integrated circuit according to an example of the present invention includes a first interconnect extending in a first direction, a second interconnect arranged over the first interconnect and extending in a second direction intersecting the first direction, a first via for connecting a first contact part of the first interconnect and a second contact part of the second interconnect, and a second via for connecting a third contact part of the first interconnect and a fourth contact part of the second interconnect. The first and third contact parts are arranged by being aligned in the first direction, and the second and fourth contact parts are arranged by being aligned in the second direction.

20 Claims, 36 Drawing Sheets

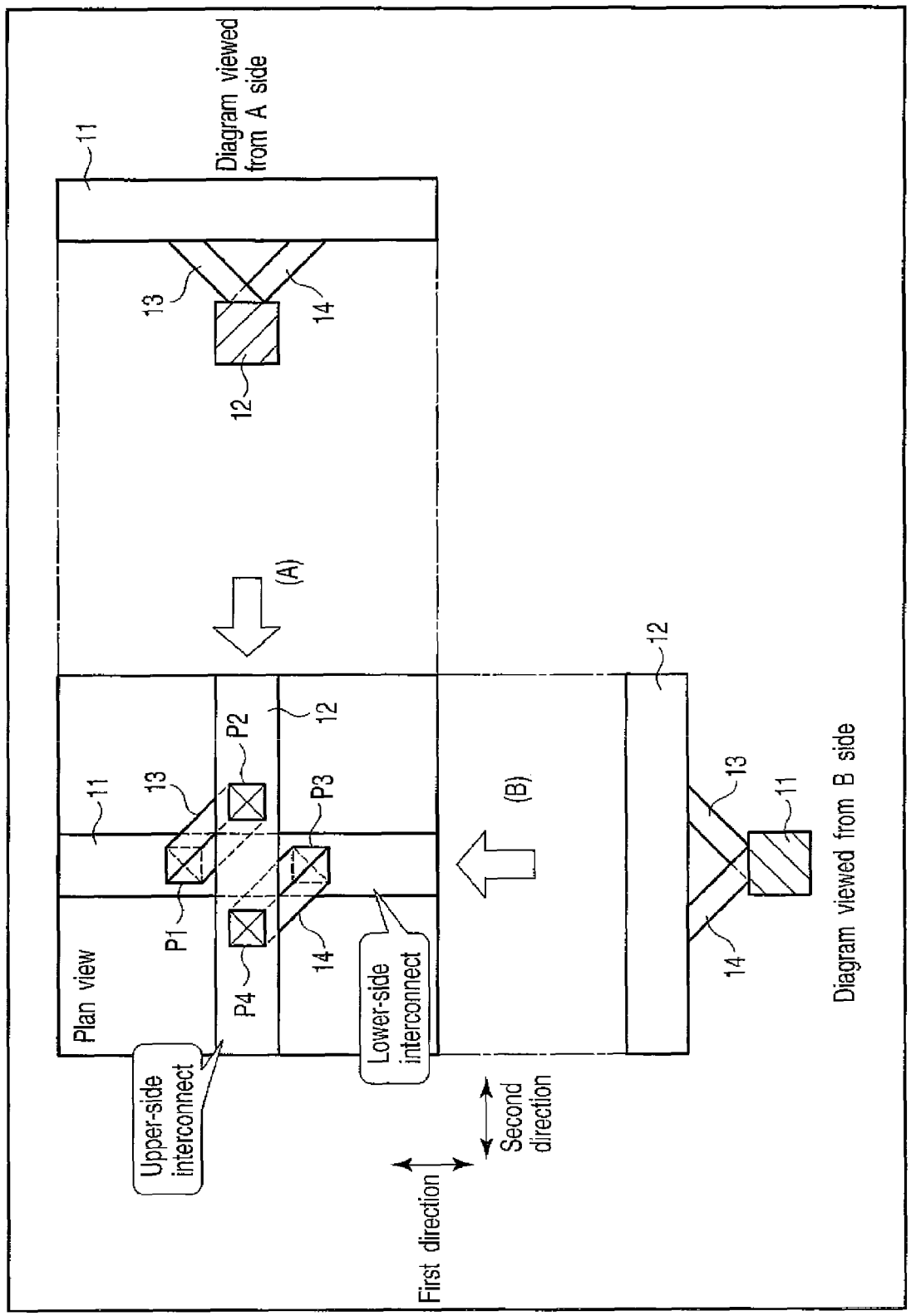
F I G. 2

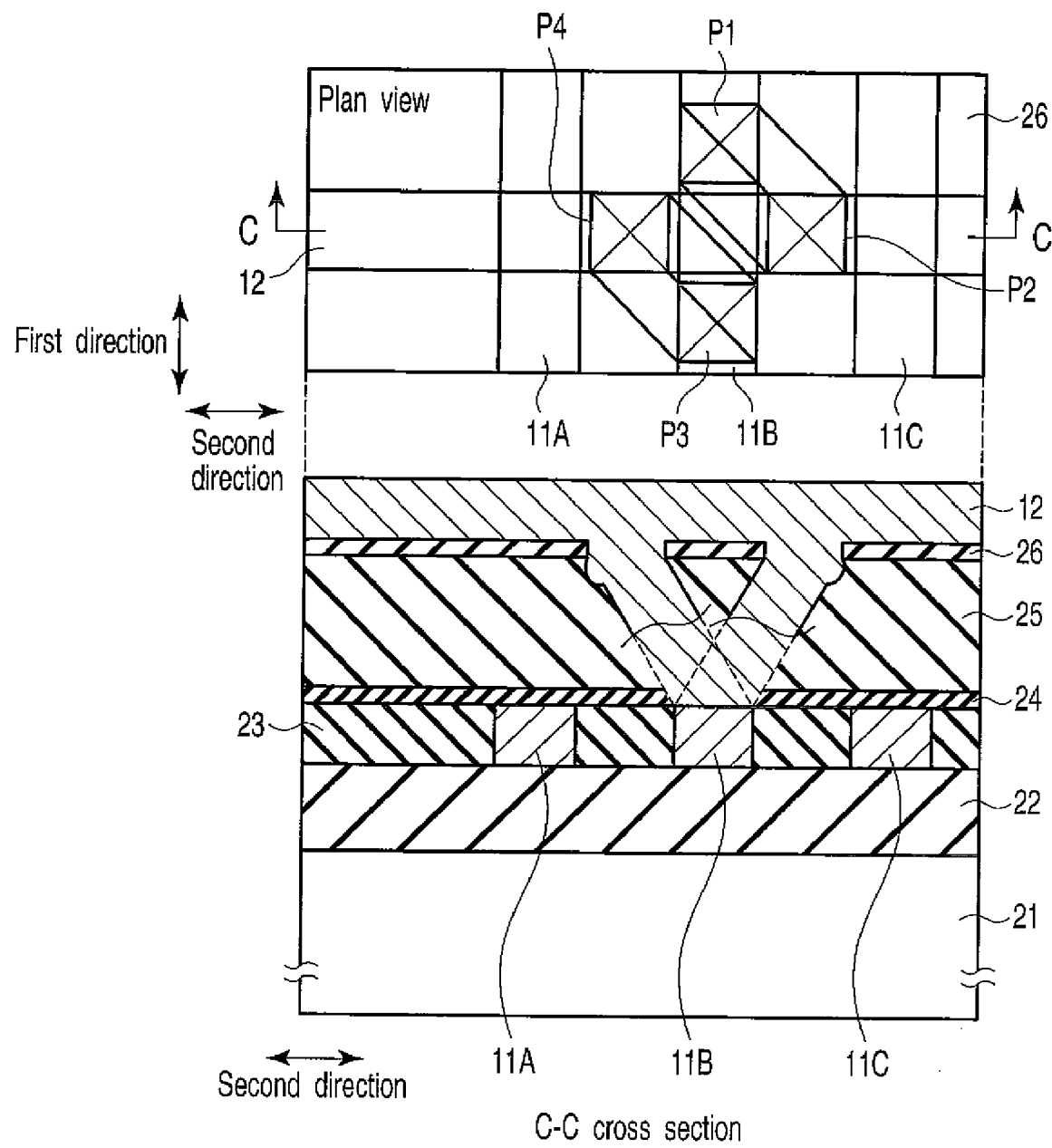
F I G. 22

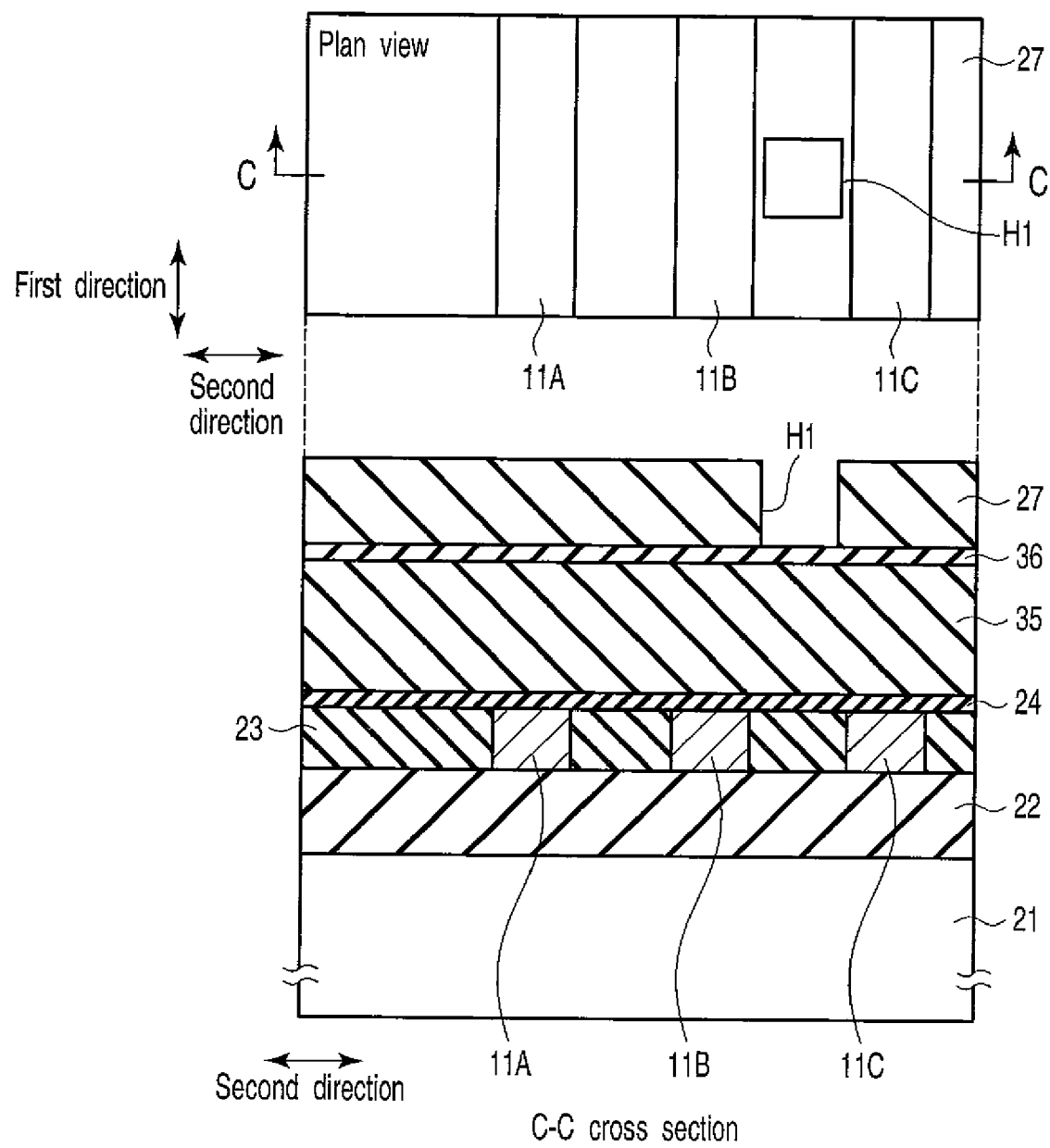
F I G. 24

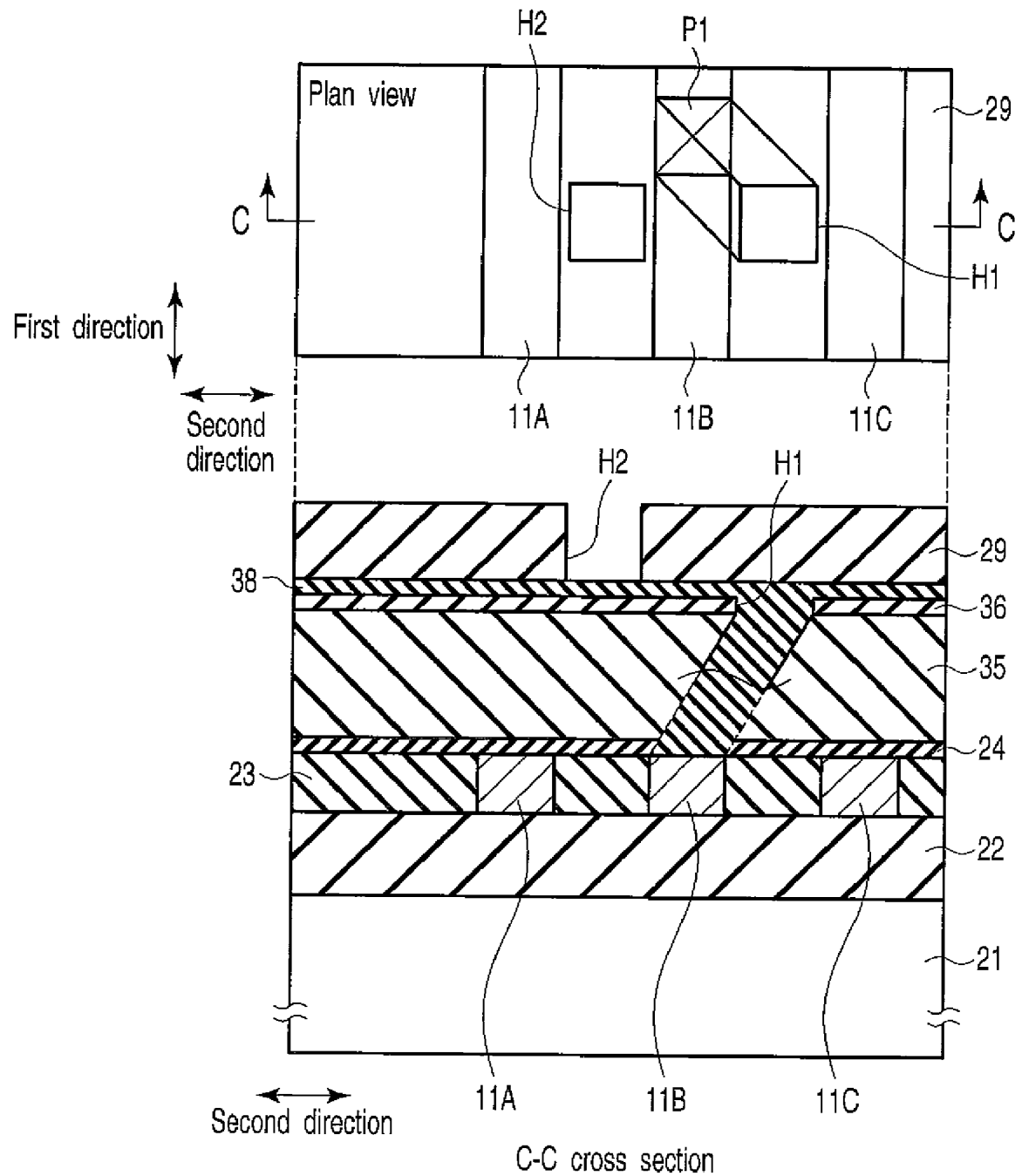
F I G. 30

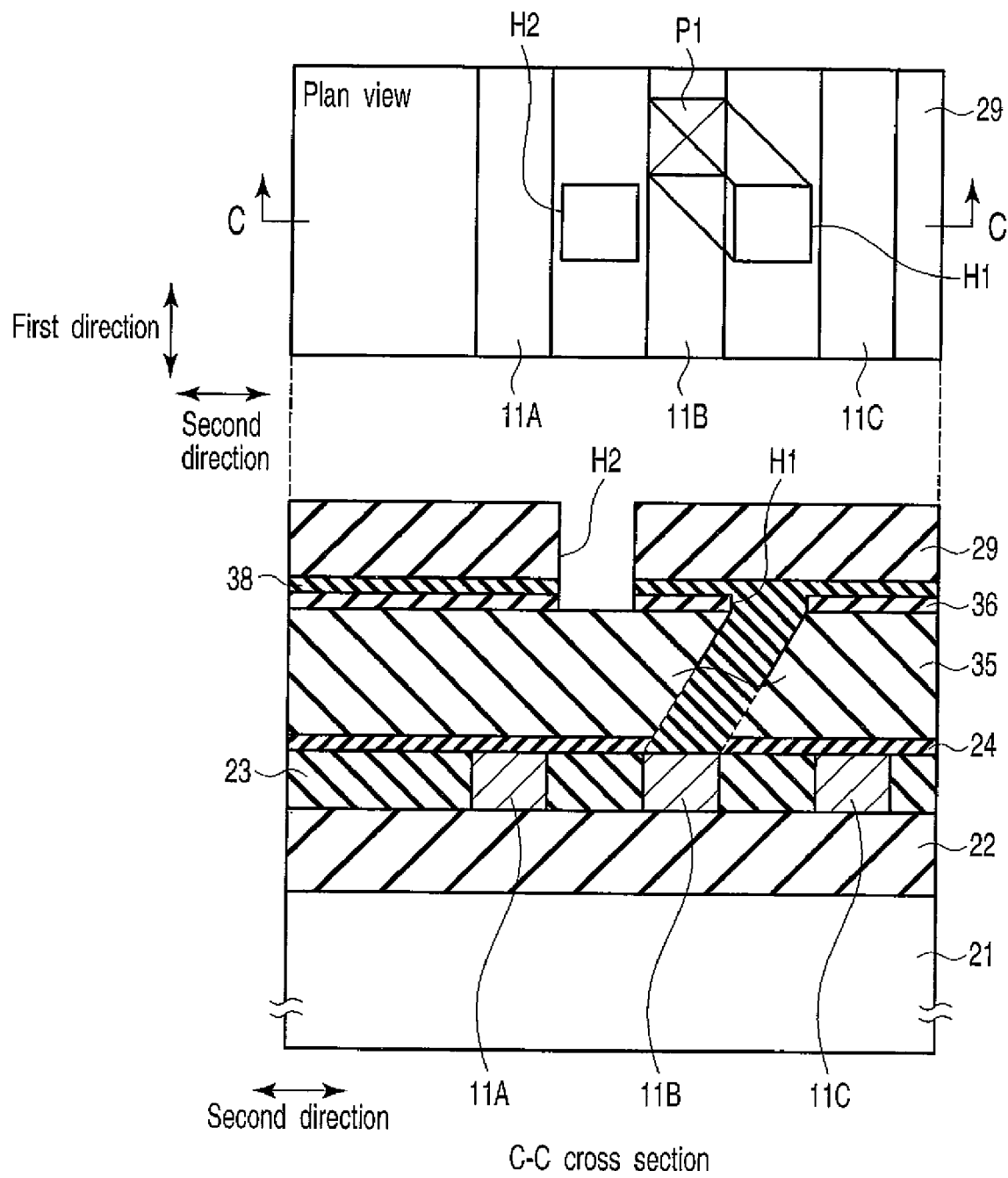
F I G. 31

SEMICONDUCTOR INTEGRATED CIRCUIT

CROSS-REFERENCE TO RELATED APPLICATIONS

This application is based upon and claims the benefit of priority from prior Japanese Patent Application No. 2007-158907, filed Jun. 15, 2007, the entire contents of which are incorporated herein by reference.

BACKGROUND OF THE INVENTION

1. Field of the Invention

The present invention relates to a via structure of a semiconductor integrated circuit.

2. Description of the Related Art

In a semiconductor integrated circuit in which interconnect layers are multi-layered, a via is adopted to electrically connect a lower-side interconnect and an upper-side interconnect that intersect mutually (See, for example, Jpn. Pat. Appln. KOKAI Publication No. 2004-63667).

One via is commonly provided at a point of intersection of a lower-side interconnect and an upper-side interconnect, but in recent years, two vias are sometimes provided at a point of intersection for the purpose of reducing interconnect resistance and improving manufacturing yields.

Particularly in a semiconductor integrated circuit whose devices are more microscopic, providing two vias at a point of intersection of a lower-side interconnect and an upper-side interconnect is becoming almost a requirement.

This is because interconnect resistance tends to increase and via defects are more likely to be caused as devices become more microscopic. If one via among many vias in a semiconductor integrated circuit becomes defective, the semiconductor integrated circuit itself will be defective so that manufacturing yields cannot be improved.

However, increasing the number of vias provided at a point of intersection of a lower-side interconnect and an upper-side interconnect from one to two means simultaneously increasing a via area at the point of intersection.

That is, to the extent of an increased via area, the number of interconnect pathways of a lower-side interconnect or an upper-side interconnect is reduced, constituting a hindrance to layout of a semiconductor integrated circuit.

BRIEF SUMMARY OF THE INVENTION

A semiconductor integrated circuit according to an aspect of the present invention comprises a first interconnect extending in a first direction, a second interconnect arranged over the first interconnect and extending in a second direction intersecting the first direction, a first via for connecting a first contact part of the first interconnect and a second contact part of the second interconnect, and a second via for connecting a third contact part of the first interconnect and a fourth contact part of the second interconnect. The first and third contact parts are arranged by being aligned in the first directions and the second and fourth contact parts are arranged by being aligned in the second direction.

A semiconductor integrated circuit according to an aspect of the present invention comprises a first interconnect extending in a first direction, a second interconnect arranged over the first interconnect and extending in a second direction intersecting the first direction, and a via for connecting a first contact part of the first interconnect and a second contact part of the second interconnect. A width of the via in the first direction at the first contact part is broader than that of the second interconnect in the first direction and the width of the via in the first direction gradually becomes narrower from the first interconnect toward the second interconnect.

A semiconductor integrated circuit according to an aspect of the present invention comprises a first interconnect extending in a first direction, a second interconnect arranged over the first interconnect and extending in a second direction intersecting the first direction, and a via for connecting a first contact part of the first interconnect and a second contact part of the second interconnect. A width of the via in the second direction at the second contact part is broader than that of the first interconnect in the second direction and the width of the via in the second direction gradually becomes narrower from the second interconnect toward the first interconnect.

BRIEF DESCRIPTION OF THE SEVERAL VIEWS OF THE DRAWING

FIG. 2 is a diagram showing a via structure in a first embodiment;

FIG. 22 is a diagram showing a process of the first manufacturing method;

FIG. 24 is a diagram showing a process of the second manufacturing method;

FIG. 30 is a diagram showing a process of the second manufacturing method;

FIG. 31 is a diagram showing a process of the second manufacturing method;

DETAILED DESCRIPTION OF THE INVENTION

A semiconductor integrated circuit of an aspect of the present invention will be described below in detail with reference to the accompanying drawings.

1. Outline

One of causes of wasting interconnect pathways in a structure (structure of a plurality of vias) in which a lower-side interconnect and an upper-side interconnect mutually intersecting are connected by a plurality of vias is a protruding portion as a contact part provided for one of the lower-side interconnect and upper-side interconnect.

An example of the present invention proposes a via structure for arranging a plurality of vias or an equivalent one at an intersection of a lower-side interconnect and an upper-side interconnect without providing a protruding portion.

More specifically, a plurality of contact parts aligned in a direction (first direction) in which a lower-side interconnect extends is provided on an upper surface of the interconnect and a plurality of contact parts aligned in a direction (second direction) in which an upper-side interconnect extends is provided on a lower surface of the interconnect. Then, the plurality of contact parts of the lower-side interconnect and the plurality of contact parts of the upper-side interconnect are made to correspond to each other 1:1 and these contact parts are connected by a plurality of vias.

In this case, at least one among the plurality of vias extends in an oblique direction with respect to the upper surface of the lower-side interconnect or the lower surface of the upper-side interconnect. Thus, such a via extending in the oblique direction will be called an "oblique via" below. A common via extending in a perpendicular direction with respect to the upper surface of the lower-side interconnect or the lower surface of the upper-side interconnect will be called a "perpendicular via".

Applications below are possible to the oblique via:

Bringing at least one of a plurality of contact parts of a lower-side interconnect and a plurality of contact parts of an upper-side interconnect into contact with each other.

Providing a via whose side is oblique at an intersection of a lower-side interconnect and an upper-side interconnect.

By adopting such a via structure, the need to provide a protruding portion on one of the lower-side interconnect and upper-side interconnect is eliminated and therefore, reliability of semiconductor integrated circuits can be improved by a plurality of vias or an equivalent one without wasting interconnect pathways.

2. Related Technique

Figure 1:
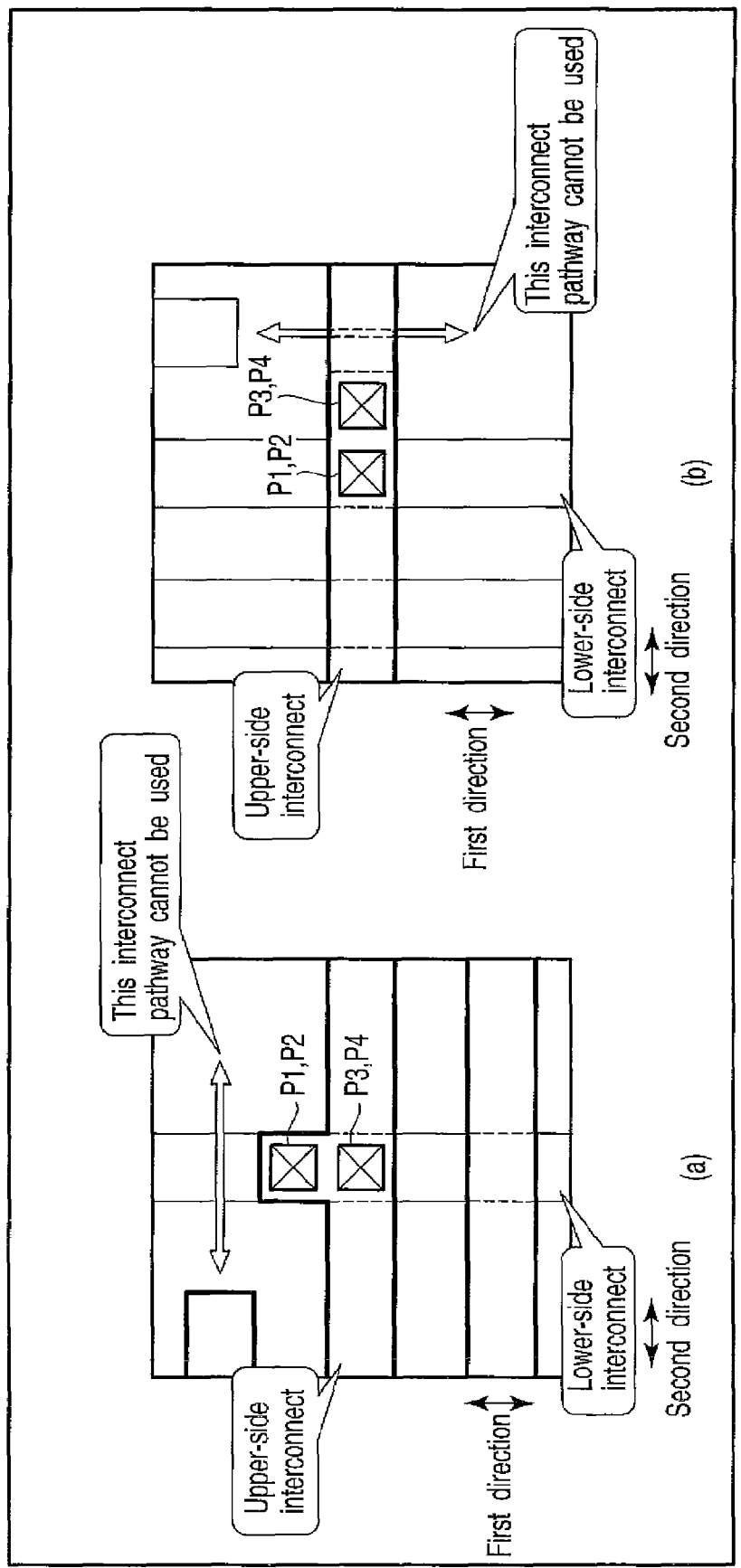
FIG. 1 is a plan view showing a via structure to be an assumption of the present invention.

First, an example in which interconnect pathways are restricted due to the structure of a plurality of vias will briefly be described with reference to FIG. 1.

A lower-side interconnect extends in the first direction and an upper-side interconnect extends in the second direction. In FIG. 1A, the upper-side interconnect is provided with a protruding portion protruding in the first direction and in FIG. 1B, the lower-side interconnect is provided with a protruding portion protruding in the second direction.

Vias are perpendicular vias.

In this case, contact parts P1, P3 of the lower-side interconnect and contact parts P2, P4 of the upper-side interconnect overlap when viewed from above them. Moreover, the contact parts P1, P3 of the lower-side interconnect and the contact parts P2, P4 of the upper-side interconnect are arranged together by being aligned in the same direction.

Therefore, as shown FIG. 1A, if the upper-side interconnect is provided with a protruding portion, the use of interconnect pathways adjacent to the upper-side interconnect is restricted and, as shown FIG. 1B, if the lower-side interconnect is provided with a protruding portion, the use of interconnect pathways adjacent to the lower-side interconnect is restricted.

Embodiments of oblique vias that do not need such a protruding portion will be described below.

3. Embodiments (1) First Embodiment

FIG. 2 shows a via structure in a first embodiment.

A lower-side interconnect (lower layer metal) 11 and an upper-side interconnect (upper layer metal) 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by two vias 13 and 14.

Here, portions with which both ends of the vias 13 and 14 are each in contact are defined as the contact parts P1, P2, P3, and P4 (This applies to all embodiments below).

That is, the via 13 connects the contact part P1 of the lower-side interconnect 11 and the contact part P2 of the upper-side interconnect 12, and the via 14 connects the contact part P3 of the lower-side interconnect 11 and the contact part P4 of the upper-side interconnect 12.

An important point to be noted is that the contact parts P1 and P3 of the lower-side interconnect 11 are arranged by being aligned in the first direction and the contact parts P2 and P4 of the upper-side interconnect 12 are arranged by being aligned in the second direction. The vias 13 and 14 are oblique vias extending in the oblique direction with respect to the upper surface of the lower-side interconnect 11 or the lower surface of the upper-side interconnect 12.

Incidentally, the vias 13 and 14 may partly be in contact mutually.

According to the first embodiment, by providing the two vias 13 and 14 at a point of intersection of the lower-side interconnect 11 and the upper-side interconnect 12, a via structure of lower resistance and higher reliability than when only one via is provided there is realized.

Moreover, by adopting oblique vias, the need to provide a protruding portion on one of the lower-side interconnect 11 and upper-side interconnect 12 is eliminated and thus, interconnect pathways will not be wasted.

(2) Second Embodiment

Figure 3:
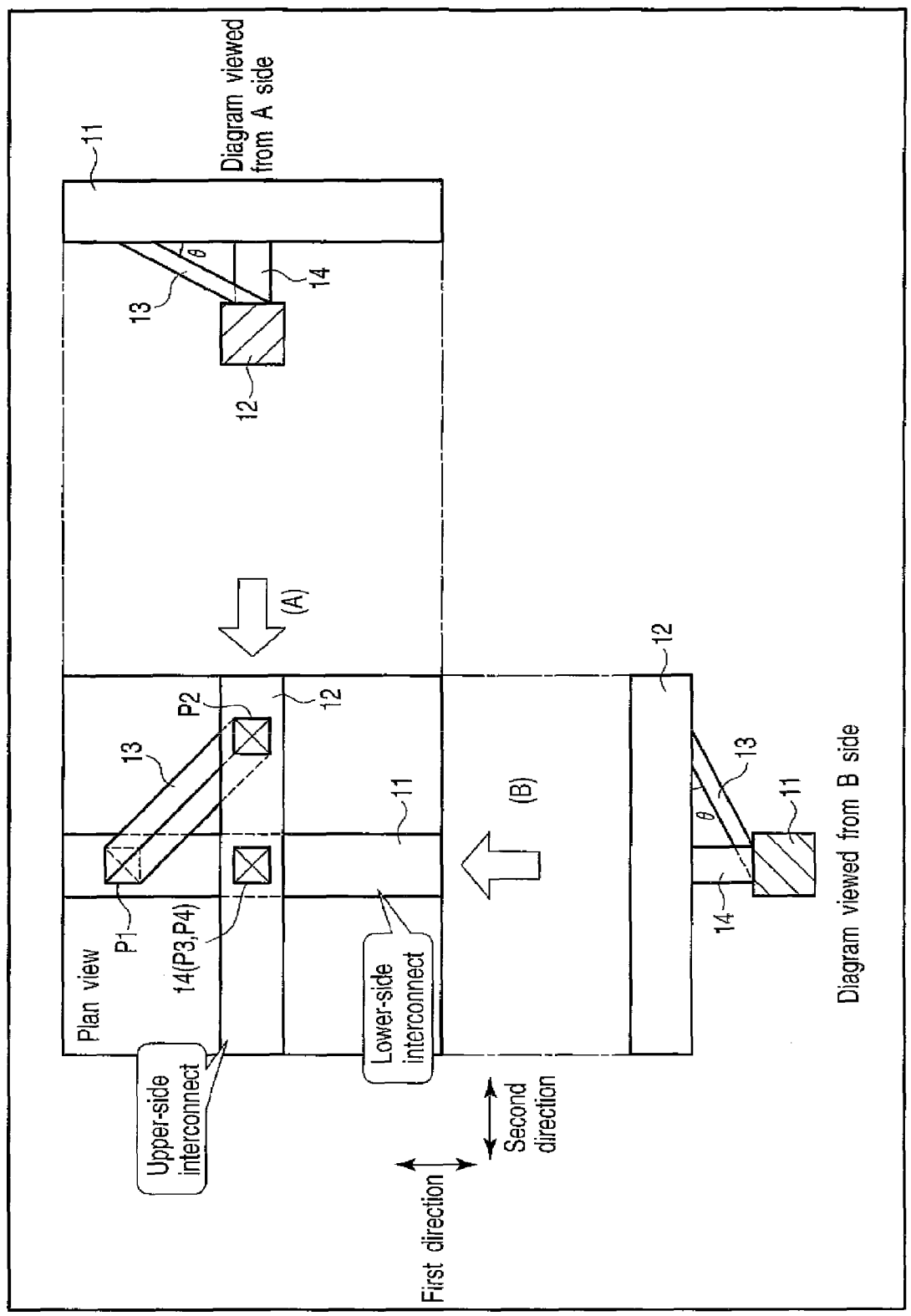
FIG. 3 is a diagram showing a via structure in a second embodiment.

FIG. 3 shows a via structure in a second embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by the two vias 13 and 14.

The via 13 connects the contact part P1 of the lower-side interconnect 11 and the contact part 22 of the upper-side interconnect 12, and the via 14 connects the contact part P3 of the lower-side interconnect 11 and the contact part P4 of the upper-side interconnect 12.

Also, like the first embodiment, the contact parts P1 and P3 of the lower-side interconnect 11 are arranged by being aligned in the first direction and the contact parts P2 and P4 of the upper-side interconnect 12 are arranged by being aligned in the second direction. However, the contact part P3 of the lower-side interconnect 11 and the contact part P4 of the upper-side interconnect 12 laid out to overlap when viewed from above them.

In this case, while the via 13 becomes an oblique via extending in the oblique direction with respect to the upper surface of the lower-side interconnect 11 or the lower surface of the upper-side interconnect 12, the via 14 becomes a perpendicular via extending in the perpendicular direction with respect to the upper surface of the lower-side interconnect 11 or the lower surface of the upper-side interconnect 12.

Here, as the distance between the contact parts P1 and P2 increases, an inclination (angle of inclination with respect to the upper surface of the lower-side interconnect 11 or the lower surface of the upper-side interconnect 12) θ of the via 13 becomes smaller. Since it is not desirable that the inclination θ becomes too small, the contact part P1 is preferably brought as close to the contact part P2 as possible.

Incidentally, the vias 13 and 14 may partly be in contact mutually.

According to the second embodiment, like the first embodiment, a via structure of lower resistance and higher reliability is realized by providing the two vias 13 and 14 at a point of intersection of the lower-side interconnect 11 and the upper-side interconnect 12. Moreover, combined use of the oblique via 13 and the perpendicular via 14 eliminates the need for a protruding portion and thus, interconnect pathways will not be wasted.

(3) Third Embodiment

Figure 4:
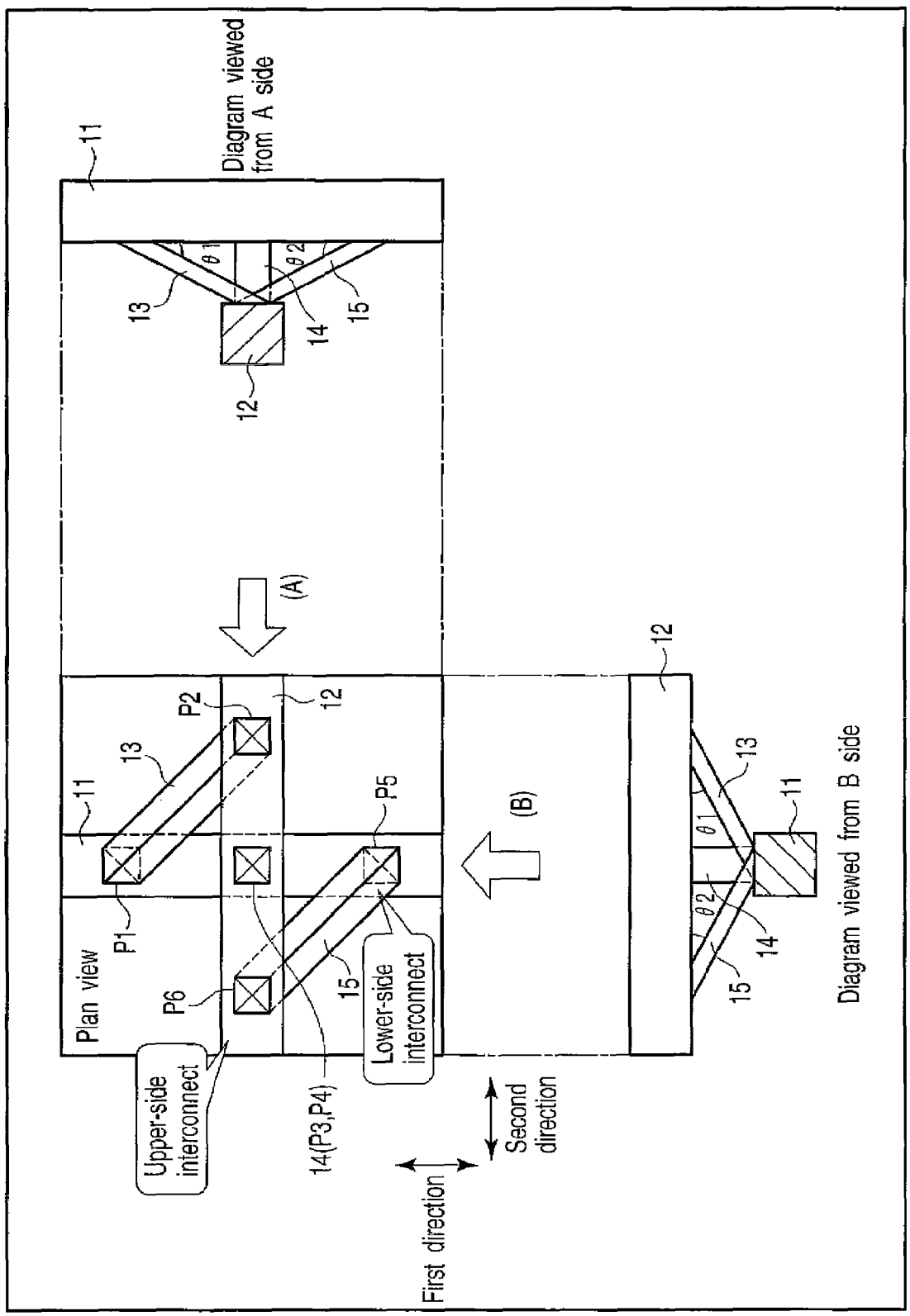
FIG. 4 is a diagram showing a via structure in a third embodiment.

FIG. 4 shows a via structure in a third embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by three vias 13, 14, and 15.

The via 13 connects the contact part P1 of the lower-side interconnect 11 and the contact part P2 of the upper-side interconnect 12, and the via 14 connects the contact part P3 of the lower-side interconnect 11 and the contact part P4 of the upper-side interconnect 12. The via P15 connects a contact part PS of the lower-side interconnect 11 and a contact part P6 of the upper-side interconnect 12.

The contact parts P1, P3, and P5 of the lower-side interconnect 11 are arranged by being aligned in the first direction and the contact parts P2, P4, and P6 of the upper-side interconnect 12 are arranged by being aligned in the second direction. Moreover, the contact part P3 of the lower-side interconnect 11 and the contact part P4 of the upper-side interconnect 12 laid out to overlap when viewed from above them.

In this case, while the vias 13 and 15 become oblique vias extending in the oblique direction with respect to the upper surface of the lower-side interconnect 11 or the lower surface of the upper-side interconnect 12, the via 14 becomes a perpendicular via extending in the perpendicular direction with respect to the upper surface of the lower-side interconnect 11 or the lower surface of the upper-side interconnect 12.

Here, like the second embodiment, it is not desirable that inclinations θ1 and θ2 of the vias 13 and 15 become too small respectively and thus, the contact parts P1 and P5 are preferably brought as close to the contact parts P2 and P6 as possible respectively.

Incidentally, the inclinations θ1 and θ2 may be the same or different. Also, the vias 13 and 14 may partly be in contact mutually, and the vias 14 and 15 may partly be in contact mutually.

According to the third embodiment, a via structure of lower resistance and higher reliability is realized by providing the three vias 13, 14, and 15 at a point of intersection of the lower-side interconnect 11 and the upper-side interconnect 12. Moreover, combined use of the oblique vias 13 and 15 and the perpendicular via 14 eliminates the need for a protruding portion and thus, interconnect pathways will not be wasted.

(4) Fourth Embodiment

Figure 5:
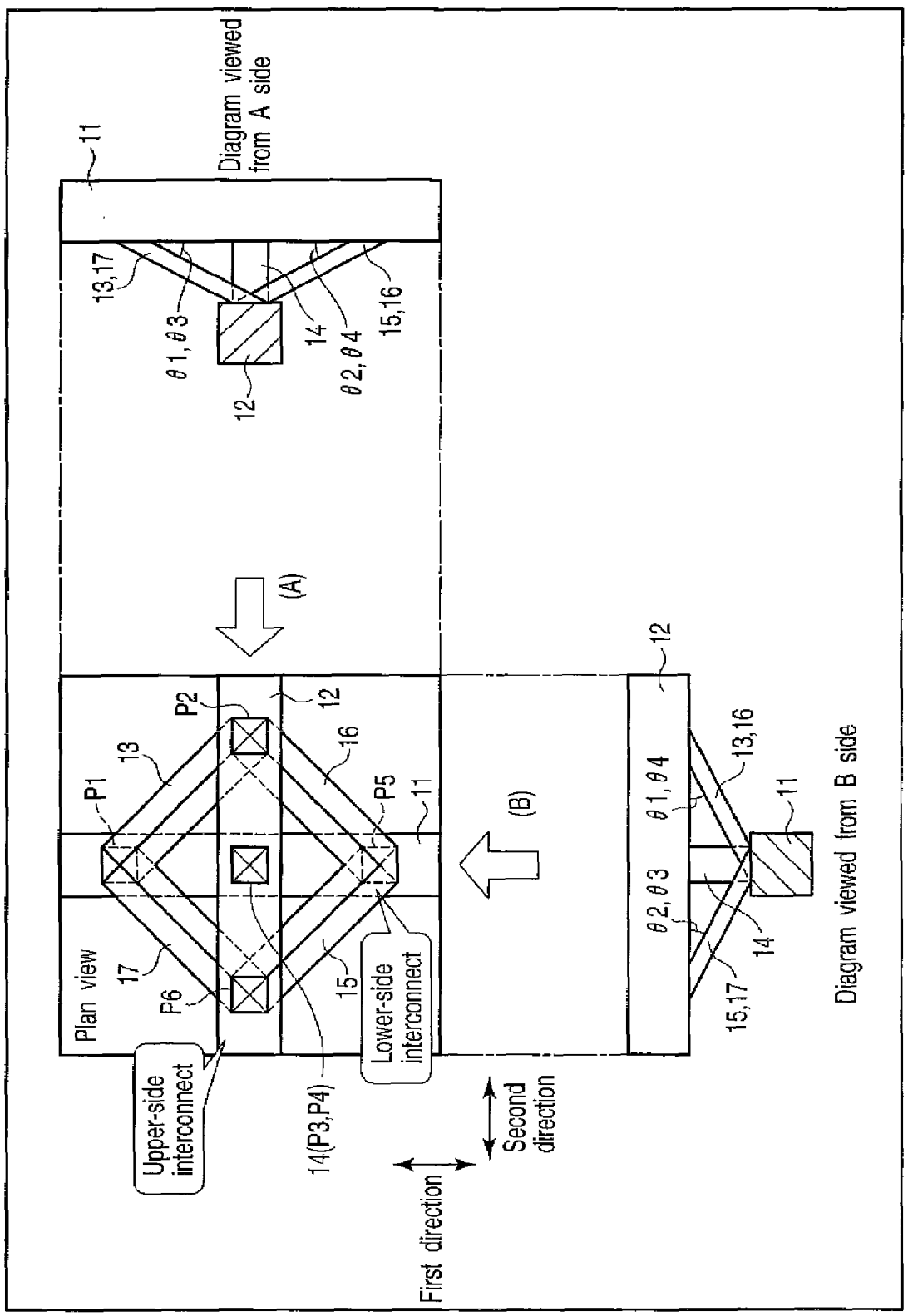
FIG. 5 is a diagram showing a via structure in a fourth embodiment.

FIG. 5 shows a via structure in a fourth embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by five vias 13, 14, 15, 16, and 17.

The via 13 connects the contact part P1 of the lower-side interconnect 11 and the contact part P2 of the upper-side interconnect 12, and the via 14 connects the contact part P3 of the lower-side interconnect 11 and the contact part P4 of the upper-side interconnect 12. The via P15 connects the contact part P5 of the lower-side interconnect 11 and the contact part P6 of the upper-side interconnect 12.

The via 16 connects the contact part P5 of the lower-side interconnect 11 and the contact part P2 of the upper-side interconnect 12, and the via 17 connects the contact part P1 of the lower-side interconnect 11 and the contact part P6 of the upper-side interconnect 12.

The contact parts P1, P3, and P5 of the lower-side interconnect 11 are arranged by being aligned in the first direction, and the contact parts P2, P4, and P6 of the upper-side interconnect 12 are arranged by being aligned in the second direction. Moreover, the contact part P3 of the lower-side interconnect 11 and the contact part P4 of the upper-side interconnect 12 laid out to overlap when viewed from above them.

In this case, while the vias 13, 15, 16, and 17 become oblique vias extending in the oblique direction with respect to the upper surface of the lower-side interconnect 11 or the lower surface of the upper-side interconnect 12, the via 14 becomes a perpendicular via extending in the perpendicular direction with respect to the upper surface of the lower-side interconnect 11 or the lower surface of the upper-side interconnect 12.

Moreover, the contact parts P1, P2, P5, and P6 are shared by two of the vias 13, 15, 16, and 17.

Here, like the second embodiment, it is not desirable that inclinations θ1, θ2, θ3, and θ4 of the vias 13, 15, 16, and 17 become too small respectively and thus, the contact parts P1 and P5 are preferably brought as close to the contact parts P2 and P6 as possible respectively.

Incidentally, the inclinations θ1, θ2, θ3, and θ4 may be the same or different. Also, the vias 13, 15, 16, and 17 may partly be in contact mutually.

According to the fourth embodiment, a via structure of lower resistance and higher reliability is realized by providing the five vias 13, 14, 15, 16, and 17 at a point of intersection of the lower-side interconnect 11 and the upper-side interconnect 12. Moreover, combined use of the oblique vias 13, 15, 16, and 17 and the perpendicular via 14 eliminates the need for a protruding portion and thus, interconnect pathways will not be wasted.

(5) Fifth Embodiment

Figure 6:
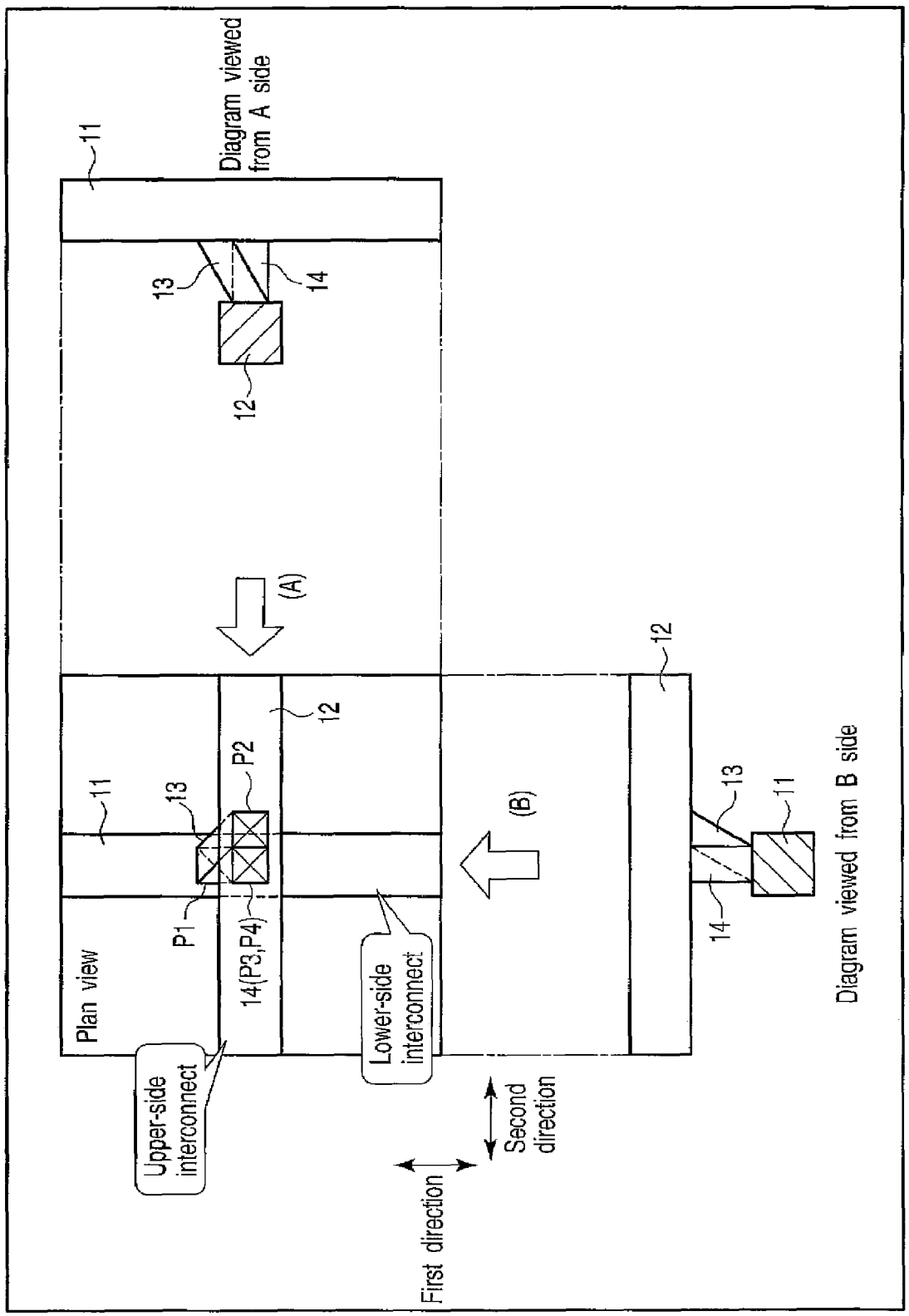
FIG. 6 is a diagram showing a via structure in a fifth embodiment.

FIG. 6 shows a via structure in a fifth embodiment.

The fifth embodiment is a modification of the second embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by the two vias 13 and 14.

The via 13 connects the contact part P1 of the lower-side interconnect 11 and the contact part P2 of the upper-side interconnect 12, and the via 14 connects the contact part P3 of the lower-side interconnect 11 and the contact part 24 of the upper-side interconnect 12.

The contact parts P1 and P3 of the lower-side interconnect 11 are arranged by being aligned in the first direction and the contact parts P2 and P4 of the upper-side interconnect 12 are arranged by being aligned in the second direction. Moreover, the contact part P3 of the lower-side interconnect 11 and the contact part P4 of the upper-side interconnect 12 laid out to overlap when viewed from above them.

Here, a difference of the fifth embodiment from the second embodiment is that the contact parts P1 and P3 of the lower-side interconnect 11 are mutually in contact, and the contact parts P2 and P4 of the upper-side interconnect 12 are mutually in contact. In this case, the two vias 13 and 14 are completely integrated to form a new via.

Incidentally, in the present embodiment, both the contact parts P1 and P3 and the contact parts P2 and P4 are mutually in contact, but it is sufficient that at least one pair of them is in contact.

According to the fifth embodiment, a via structure of lower resistance and higher reliability is realized by the integrated vias 13 and 14 without wasting interconnect pathways.

(6) Sixth Embodiment

Figure 7:
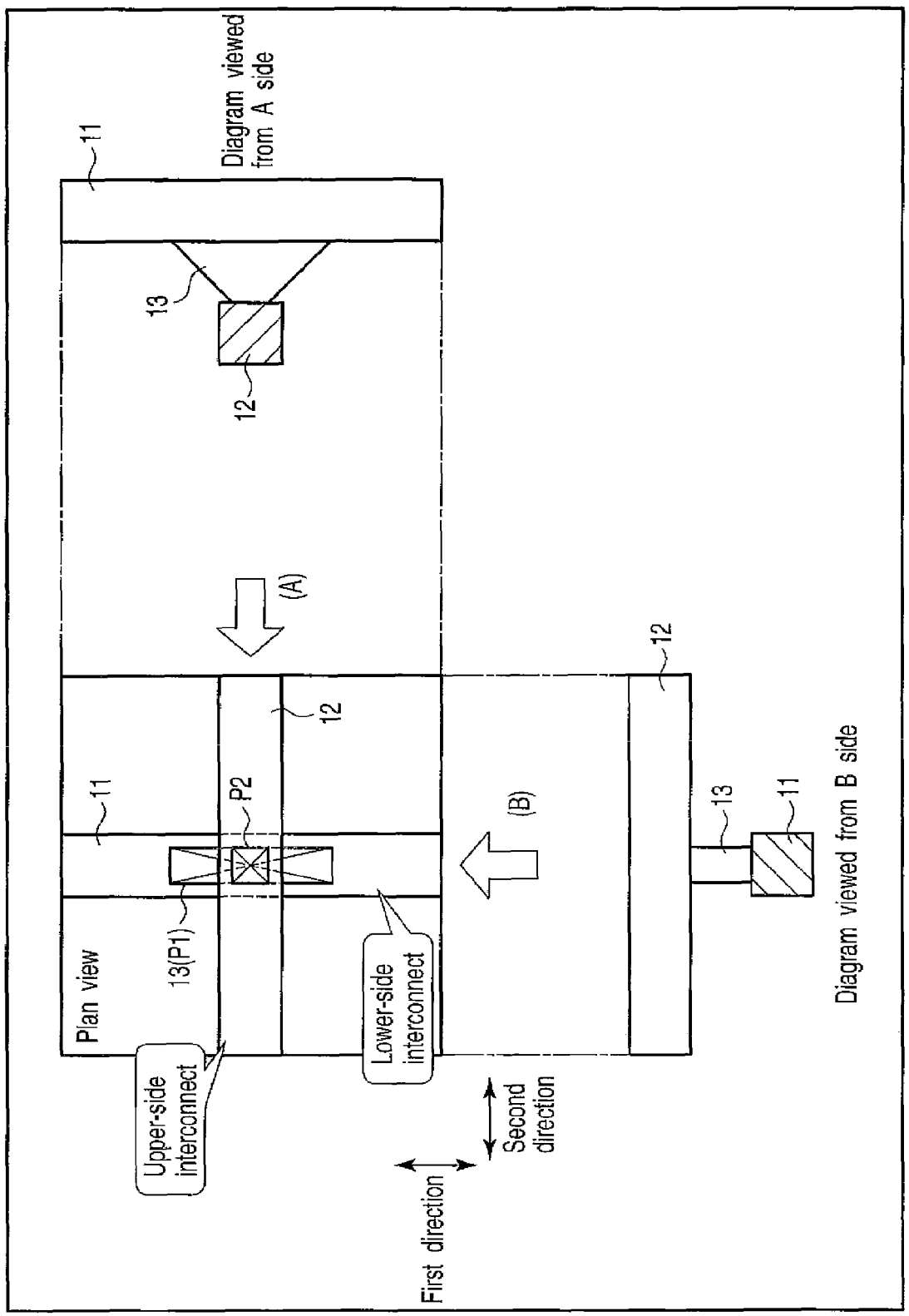
FIG. 7 is a diagram showing a via structure in a sixth embodiment.

FIG. 7 shows a via structure in a sixth embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by one via 13.

That is, the via 13 connects the contact part P1 of the lower-side interconnect 11 and the contact part P2 of the upper-side interconnect 12.

Here, the width of the via 13 in the first direction at the contact part P1 of the lower-side interconnect 11 is broader than that of the upper-side interconnect 12 in the first direction, and the width of the via 13 in the first direction gradually becomes narrower from the lower-side interconnect 11 toward upper-side interconnect 12.

Moreover, the side of the via 13 in the first direction is oblique with respect to the upper surface of the lower-side interconnect 11 or the lower surface of the upper-side interconnect 12.

According to the sixth embodiment, a via structure of lower resistance and higher reliability is realized because, though there is only one via 13 provided at a point of intersection of the lower-side interconnect 11 and the upper-side interconnect 12, the sectional area of the via 13 at the contact part 21 is greater than that of a conventional via.

Moreover, the side of the via 13 is made oblique and thus, the need to provide a protruding portion on one of the lower-side interconnect 11 and upper-side interconnect 12 is eliminated, wasting no interconnect pathways.

(7) Seventh Embodiment

Figure 8:
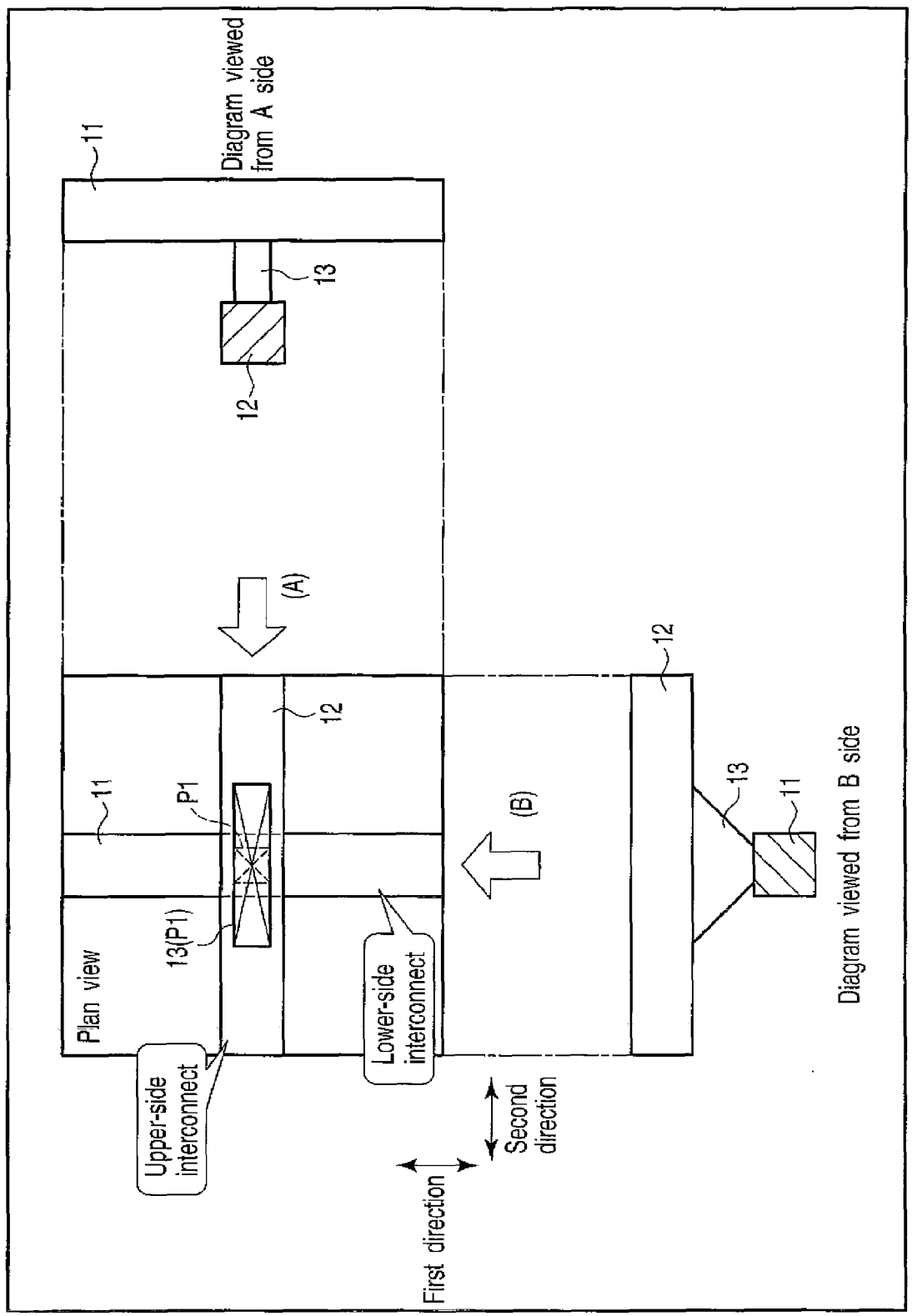
FIG. 8 is a diagram showing a via structure in a seventh embodiment.

FIG. 8 shows a via structure in a seventh embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by one via 13.

That is, the via 13 connects the contact part P1 of the lower-side interconnect 11 and the contact part P2 of the upper-side interconnect 12.

Here, the width of the via 13 in the second direction at the contact part P2 of the upper-side interconnect 12 is broader than that of the lower-side interconnect 11 in the second direction, and the width of the via 13 in the second direction gradually becomes narrower from the upper-side interconnect 12 toward the lower-side interconnect 11.

Moreover, the side of the via 13 in the second direction is oblique with respect to the upper surface of the lower-side interconnect 11 or the lower surface of the upper-side interconnect 12.

According to the seventh embodiment, like the sixth embodiment, a via structure of lower resistance and higher reliability is realized because, though there is only one via 13, the sectional area of the via 13 at the contact part P2 is greater than that of a conventional via.

Moreover, the side of the via 13 is made oblique and thus, the need to provide a protruding portion on one of the lower-side interconnect 11 and upper-side interconnect 12 is eliminated, wasting no interconnect pathways.

(8) Eighth Embodiment

Figure 9:
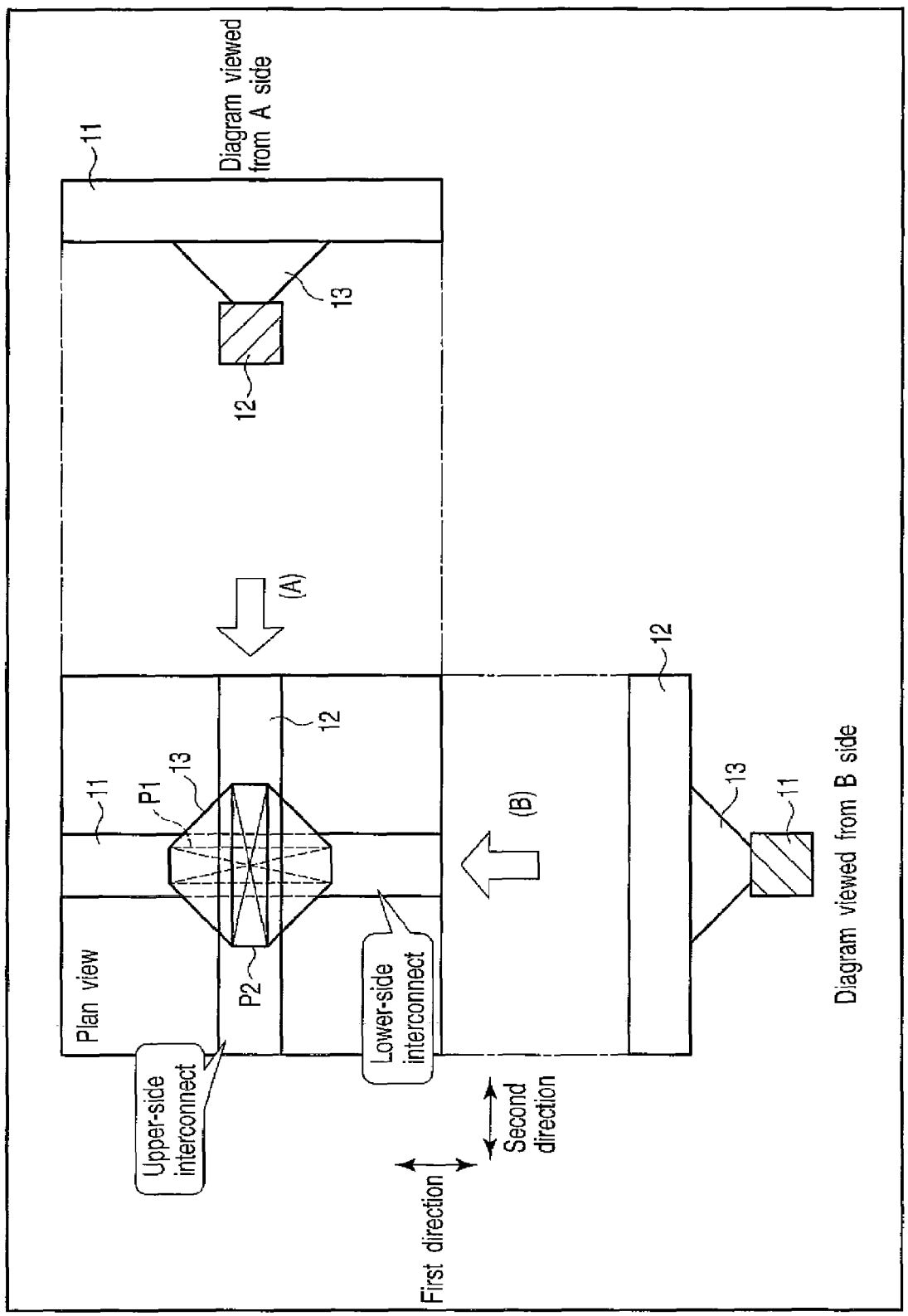
FIG. 9 is a diagram showing a via structure in a eighth embodiment.

FIG. 9 shows a via structure in an eighth embodiment.

The eighth embodiment is a combination of the sixth embodiment and the seventh embodiment.

The lower-side interconnect 11 and the upper-side interconnect 12 are interconnects of a semiconductor integrated circuit and both are arranged, for example, on a semiconductor substrate.

The lower-side interconnect 11 extends in the first direction and the upper-side interconnect 12 extends in the second direction intersecting the first direction. The lower-side interconnect 11 and the upper-side interconnect 12 are mutually electrically connected by one via 13.

That is, the via 13 connects the contact part P1 of the lower-side interconnect 11 and the contact part P2 of the upper-side interconnect 12.

Here, the width of the via 13 in the first direction at the contact part P1 of the lower-side interconnect 11 is broader than that of the upper-side interconnect 12 in the first direction. The width of the via 13 in the second direction at the contact part P2 of the upper-side interconnect 12 is broader than that of the lower-side interconnect 11 in the second direction.

In this case, the width of the via 13 in the first direction gradually becomes narrower from the lower-side interconnect 11 toward upper-side interconnect 12, and that of the via 13 in the second direction gradually becomes narrower from the upper-side interconnect 12 toward the lower-side interconnect 11.

The side of the via 13 in the first direction and that in the second direction are oblique with respect to the upper surface of the lower-side interconnect 11 or the lower surface of the upper-side interconnect 12.

According to the eighth embodiment, a via structure of lower resistance and higher reliability is realized because the sectional area of the via 13 at the contact part P1 and that at the contact part P2 are greater than that of a conventional via.

Moreover, the side of the via 13 is made oblique and thus, the need to provide a protruding portion on one of the lower-side interconnect 11 and upper-side interconnect 12 is eliminated, wasting no interconnect pathways.

(9) Others

According to the present invention, as described in the first to eighth embodiments above, a plurality of vias or an equivalent one can be arranged at an intersection of a lower-side interconnect and an upper-side interconnect without wasting interconnect pathways.

4. Manufacturing Method

The method for manufacturing a semiconductor integrated circuit in the present invention will be exemplified.

Here, as a typical example, the manufacturing method for obtaining the via structure described in the first embodiment will be described. The via structures in the second to eighth embodiments can easily be realized by combining manufacturing methods described below and well-known art.

(1) FIRST EXAMPLE

FIGS. 10 to 22 show a first example of the manufacturing method. In these diagrams, the upper diagram is a plan view and the lower diagram is a sectional view along the line C-C in the upper diagram.

Figure 10:
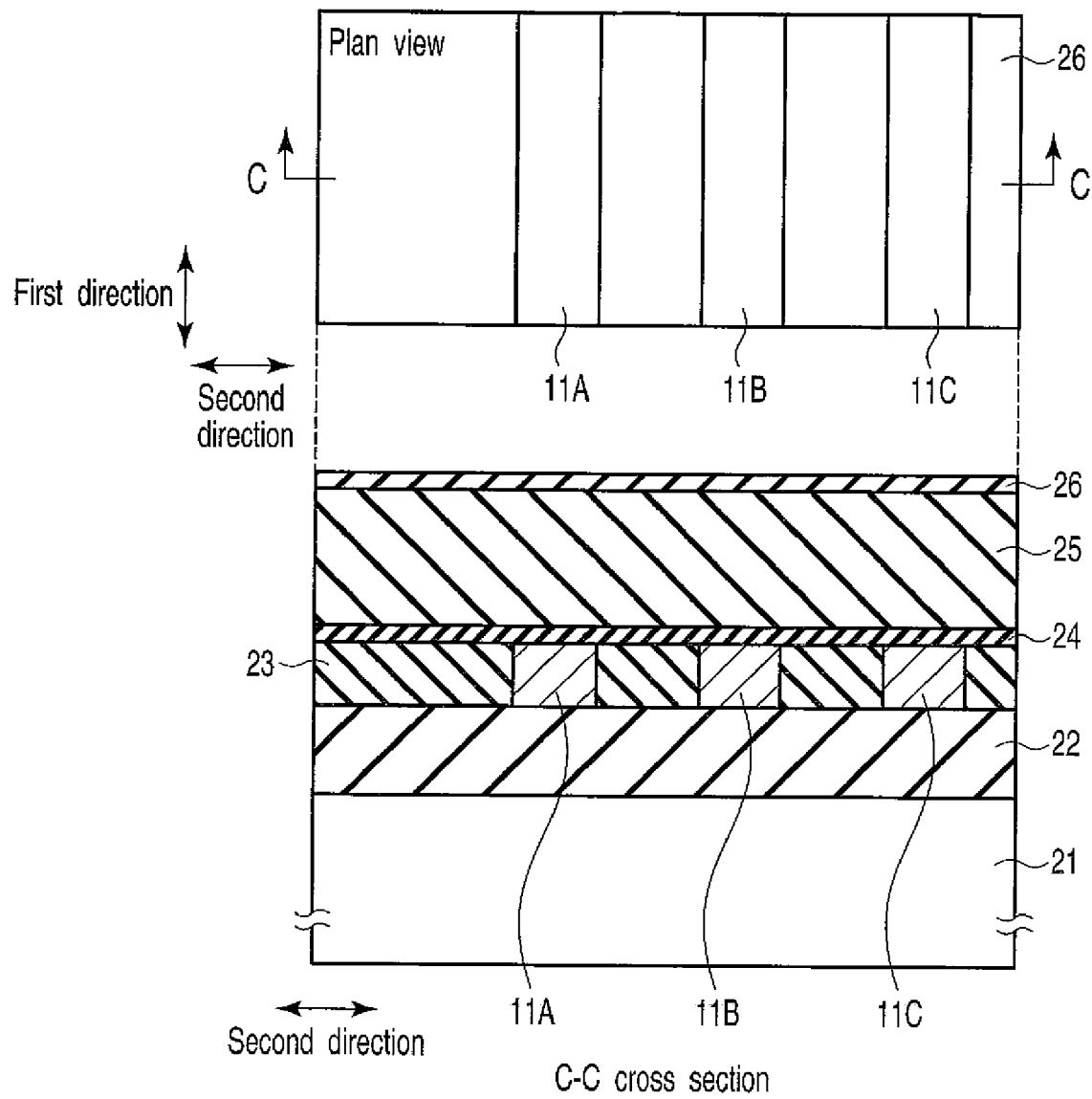
FIG. 10 is a diagram showing a process of a first manufacturing method.

First, as shown in FIG. 10, insulating layers 22 and 23 are formed on a semiconductor substrate 21 and then grooves extending in the first direction are formed in the insulating layer 23. The grooves after being filled with a conductive material are called lower-side interconnects (lower layer metal) 11A, 11B, and 11C.

A diffusion prevention layer 24 is formed on the lower-side interconnects 11A, 11B, and 11C and the insulating layer 23, and an inter-layer insulating layer 25 is formed on the diffusion prevention layer 24. Further, a hard mask 26 is formed on the inter-layer insulating layer 25.

Here, in this example, the diffusion prevention layer 24 is formed of material such as SiCN, SiC, and SiN, and the inter-layer insulating layer 25 is formed of material such as $SiO_2$ and SiOCH. The hard mask 26 is formed of material such as SiN, amorphous Si, and SiC.

Figure 11:
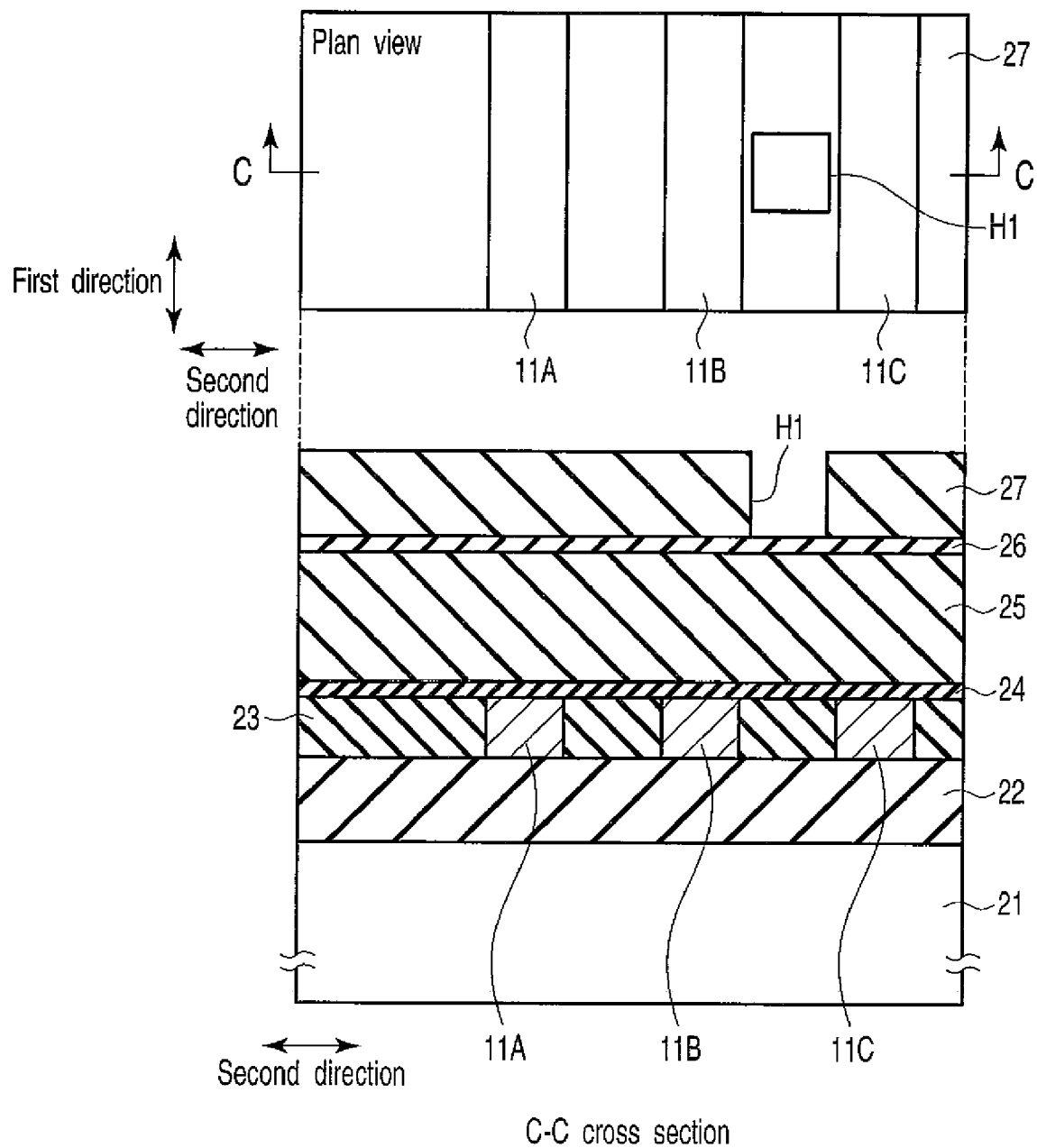
FIG. 11 is a diagram showing a process of the first manufacturing method.

Next, as shown in FIG. 11, a photoresist 27 having an opening H1 is formed on the hard mask 26 by a PEP (photo engraving process).

Figure 12:
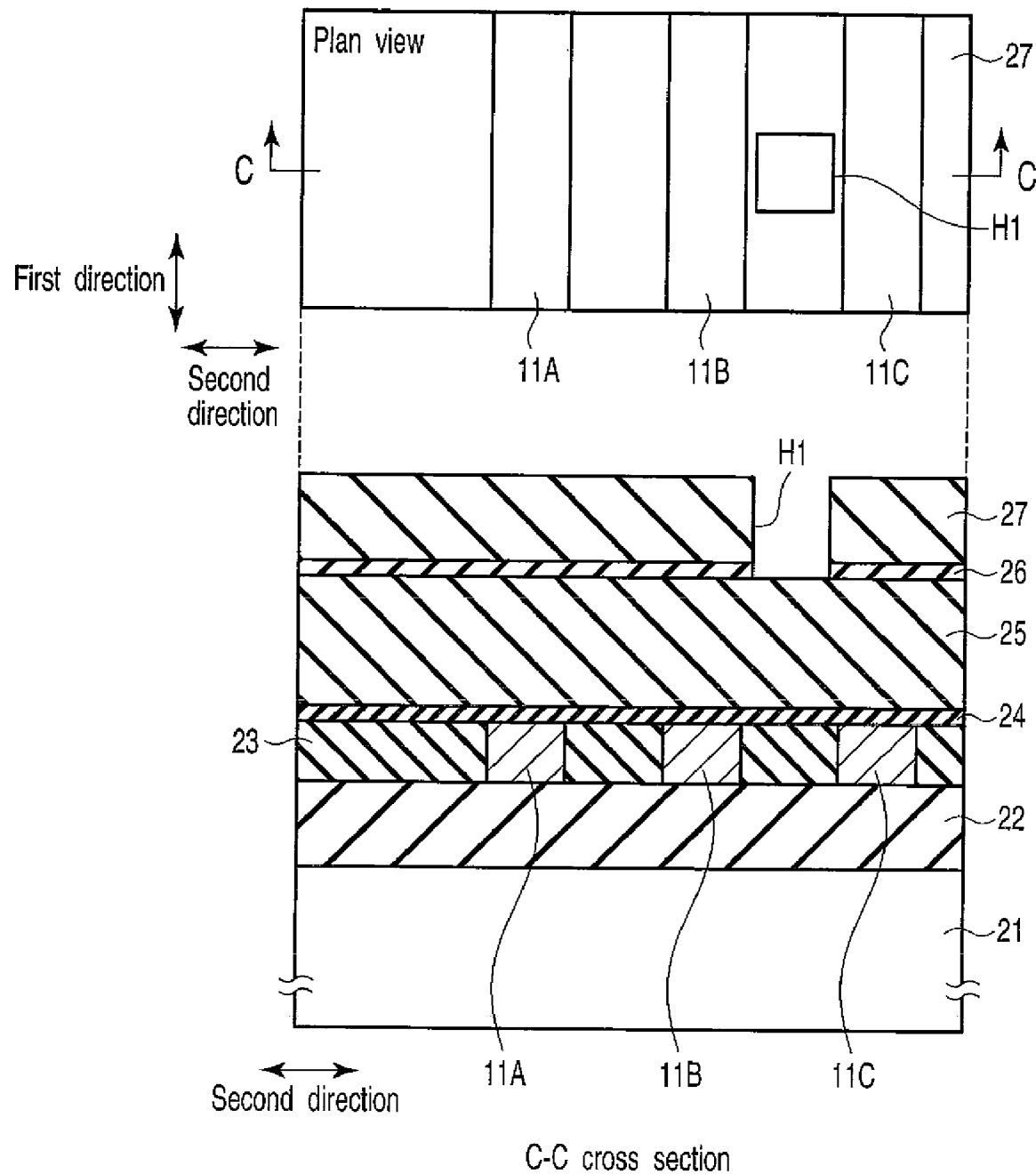
FIG. 12 is a diagram showing a process of the first manufacturing method.
Figure 13:
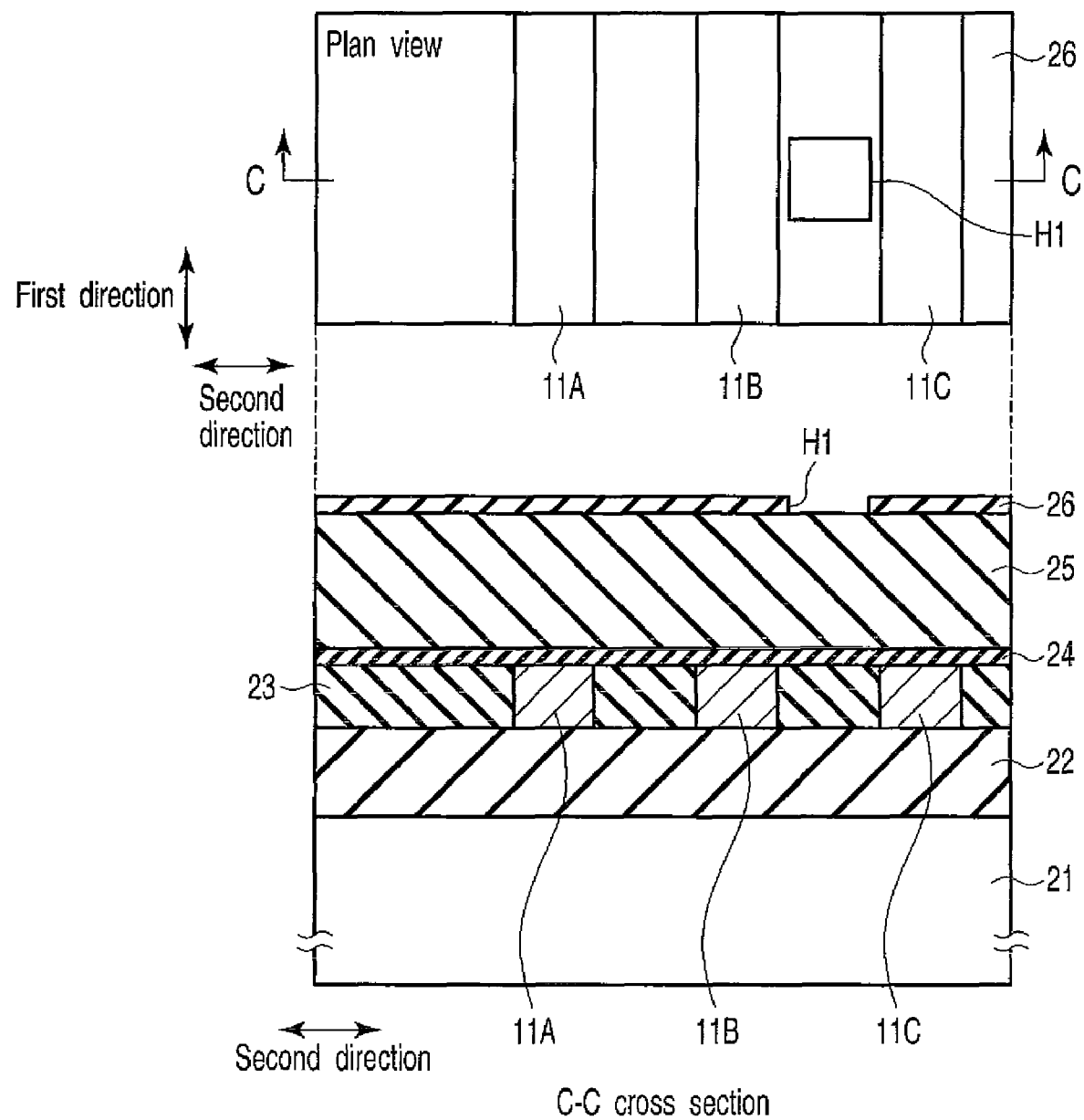
FIG. 13 is a diagram showing a process of the first manufacturing method.

Then, as shown in FIG. 12, the hard mask 26 is etched by RIE using the photoresist 27 as a mask to transfer a pattern of the photoresist 27 to the hard mask 26. Subsequently, the photoresist 27 is separated to form, as shown in FIG. 13, the hard mask 26 having the opening H1.

Figure 14:
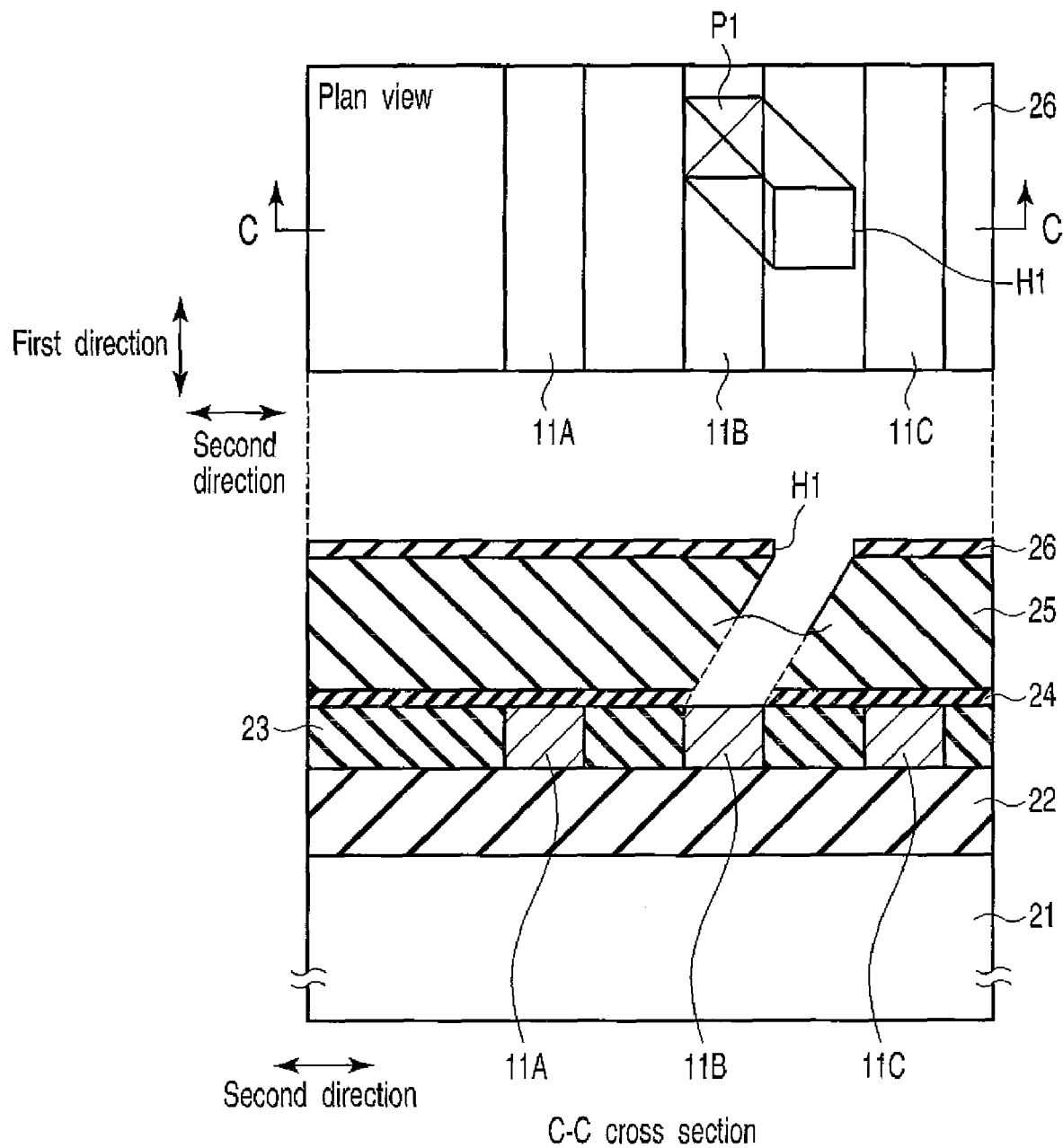
FIG. 14 is a diagram showing a process of the first manufacturing method.

Next, as shown in FIG. 14, the inter-layer insulating layer 25 is etched by RIE using the hard mask 26 as a mask to form a via hole H1 extending in the oblique direction inside the inter-layer insulating layer 25. Here, to form such an oblique via hole H1, the semiconductor substrate (a wafer, for example) 21 may be placed inside a chamber of RIE while the semiconductor substrate 21 is tilted.

Accordingly, the oblique via hole H1 reaching the contact part P1 of the lower-side interconnect 11B is formed by performing RIE in a common method.

Figure 15:
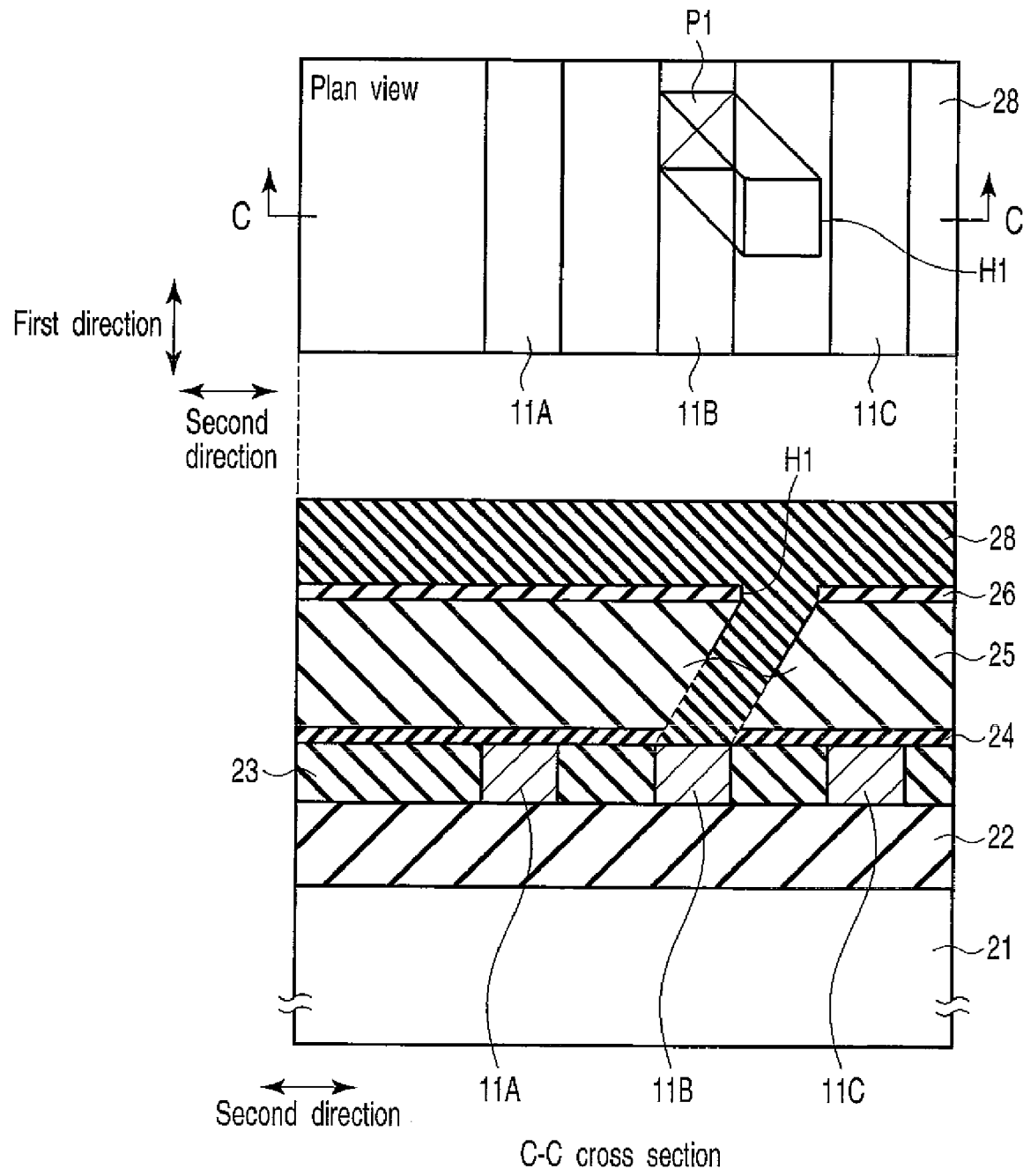
FIG. 15 is a diagram showing a process of the first manufacturing method.

Next, as shown in FIG. 15, the oblique via hole H1 is filled, for example, with a protective layer 28 formed of organic materials. The protective layer 28 is preferably formed of material having an etching selection ratio for the inter-layer insulating layer 25.

Figure 16:
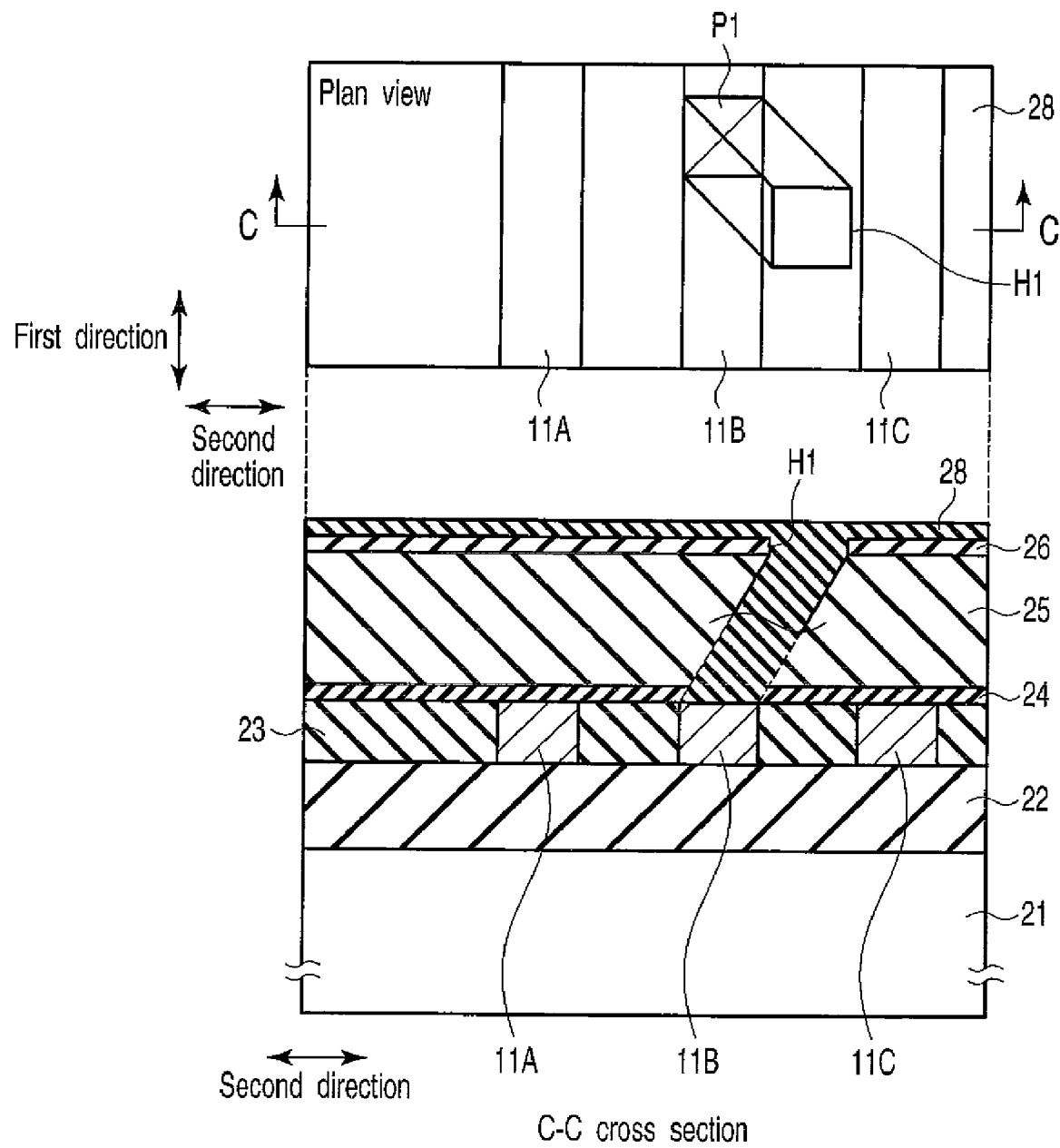
FIG. 16 is a diagram showing a process of the first manufacturing method.

Then, as shown in FIG. 16, the excessive protective layer 28 on the hard mask 26 is removed. However, the protective layer 28 needs to completely fill the via hole H1 and thus, the protective layer 28 is etched so as to leave a thin film thereof on the hard mask 26.

Figure 17:
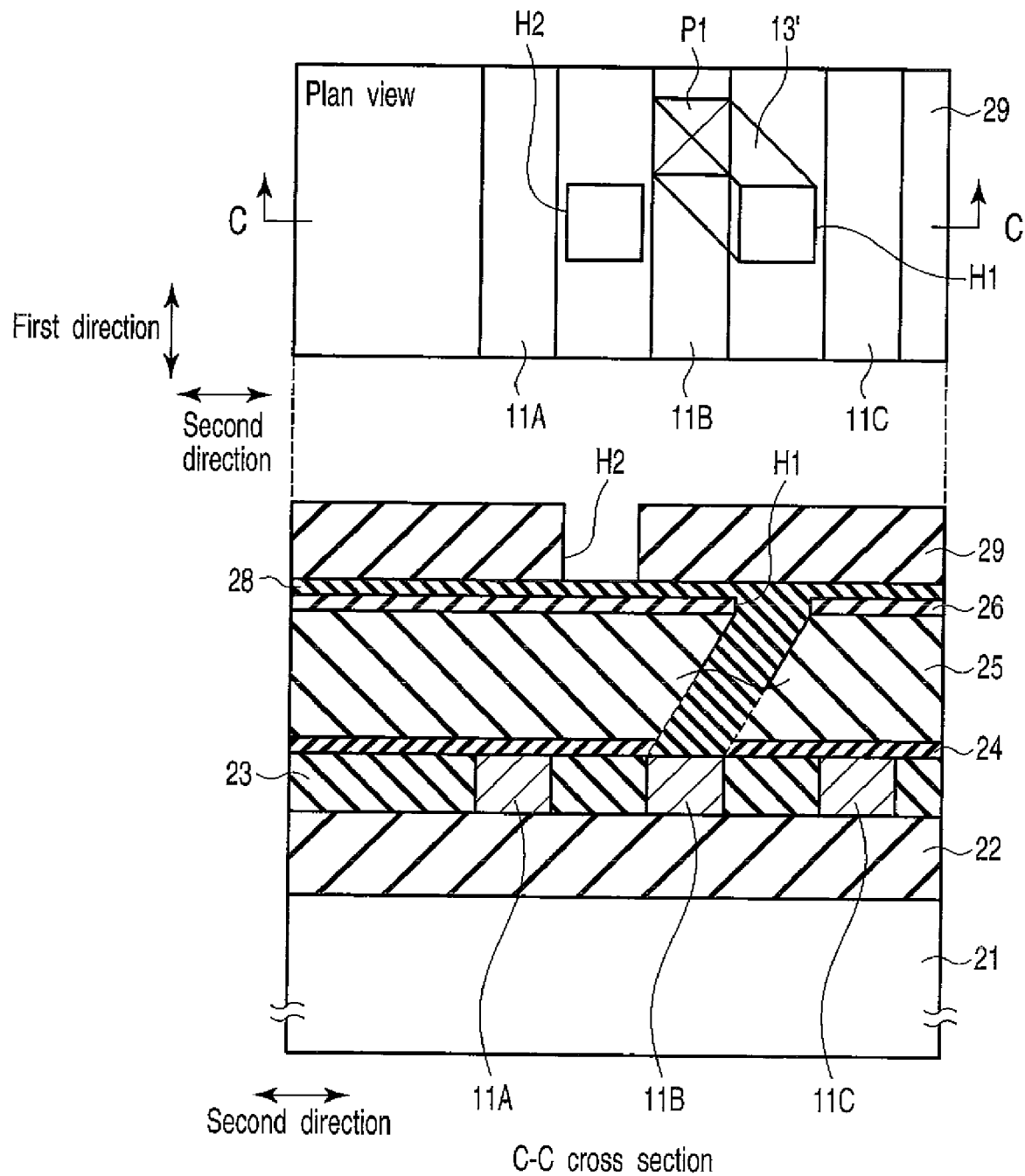
FIG. 17 is a diagram showing a process of the first manufacturing method.

Next, as shown in FIG. 17, a photoresist 29 having an opening H2 is formed by PEP on the protective layer 28.

Figure 18:
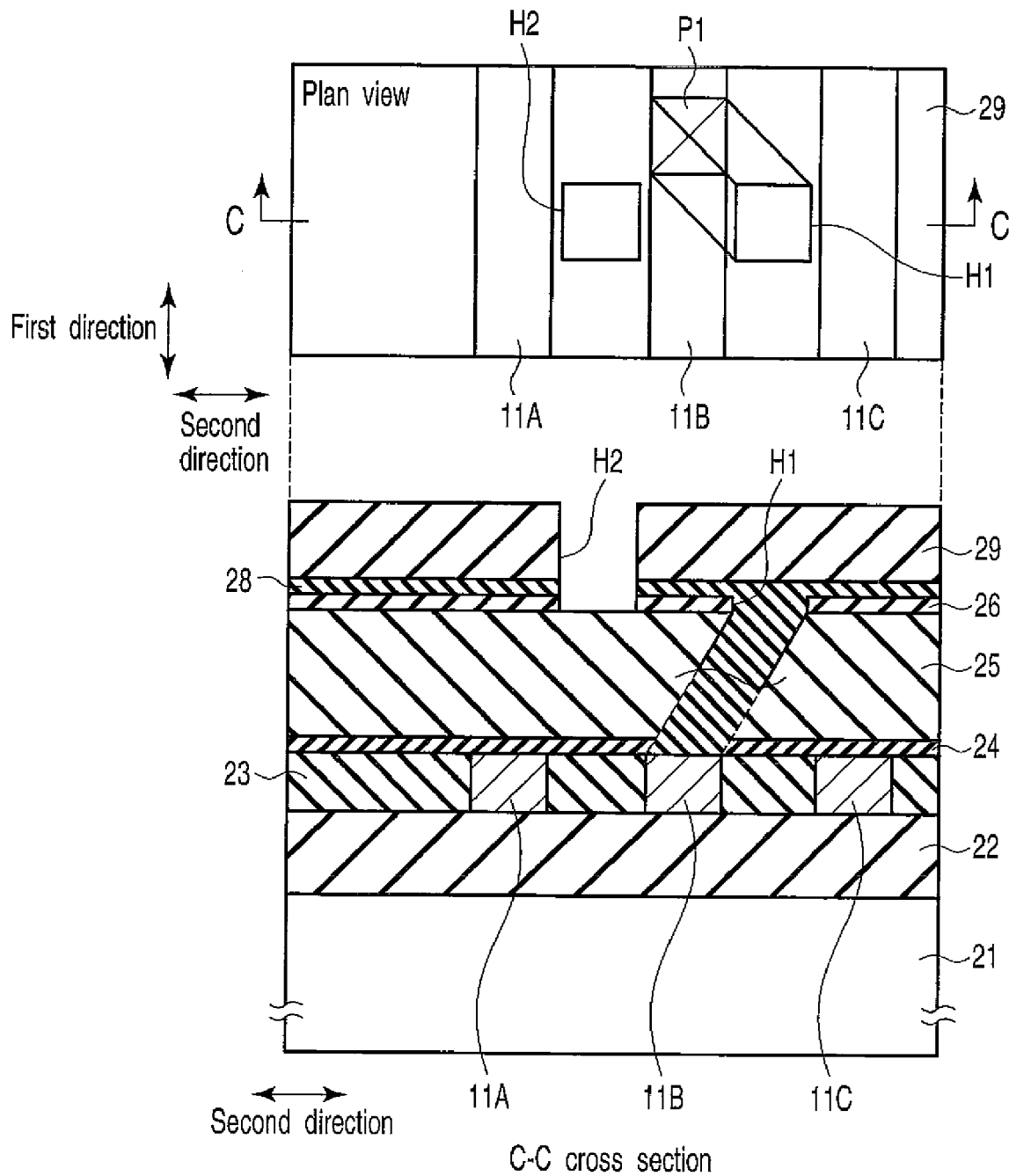
FIG. 18 is a diagram showing a process of the first manufacturing method.
Figure 19:
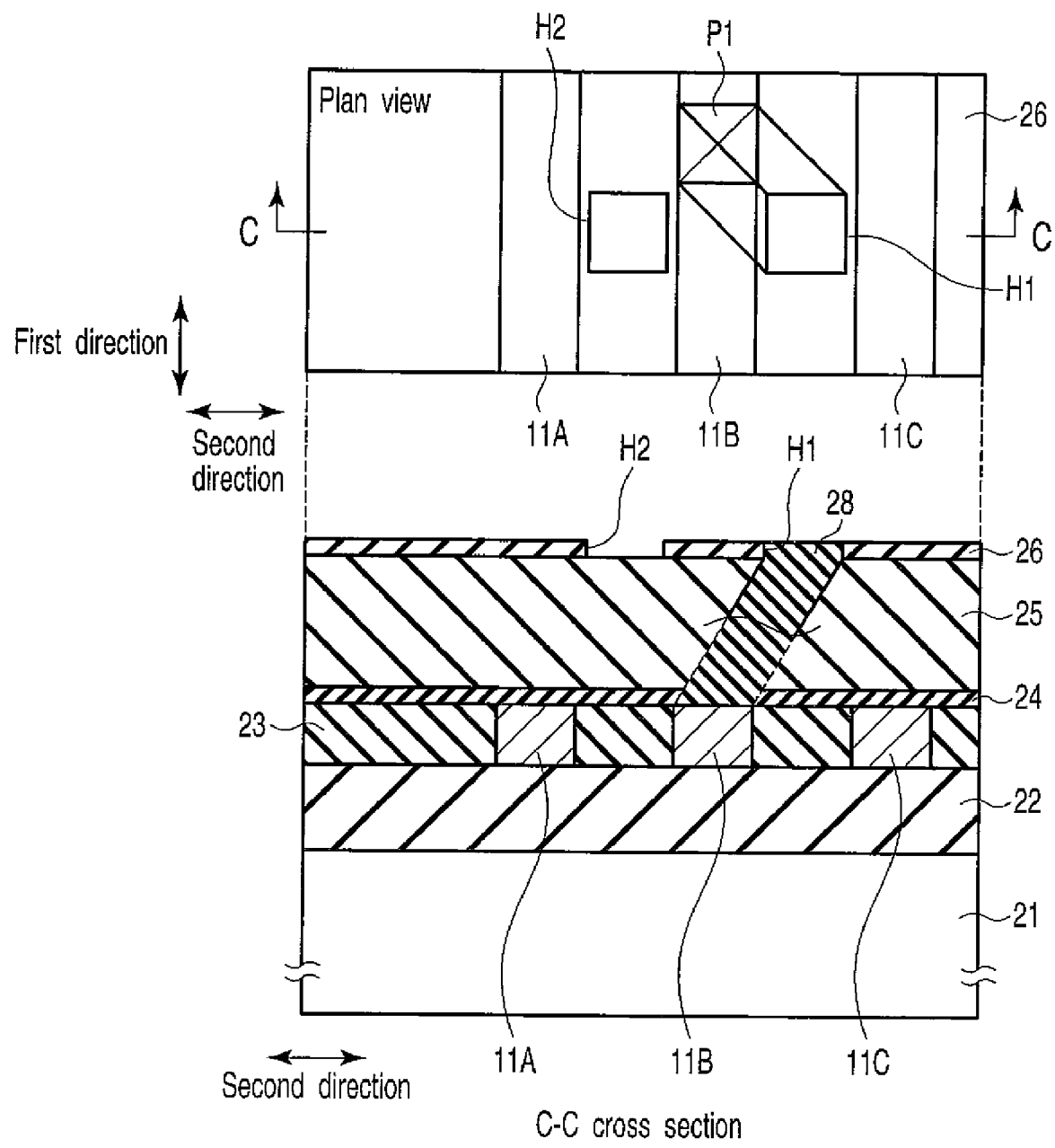
FIG. 19 is a diagram showing a process of the first manufacturing method.

Then, as shown in FIG. 18, the protective layer 28 and the hard mask 26 are etched by RIE using the photoresist 29 as a mask to transfer a pattern of the photoresist 29 to the hard mask 26. Subsequently, the photoresist 29 is separated to form, as shown in FIG. 19, the hard mask 26 having the opening H2.

At a step of separating the photoresist 29, almost all the protective layer 28 on the hard mask 26 is simultaneously removed.

Figure 20:
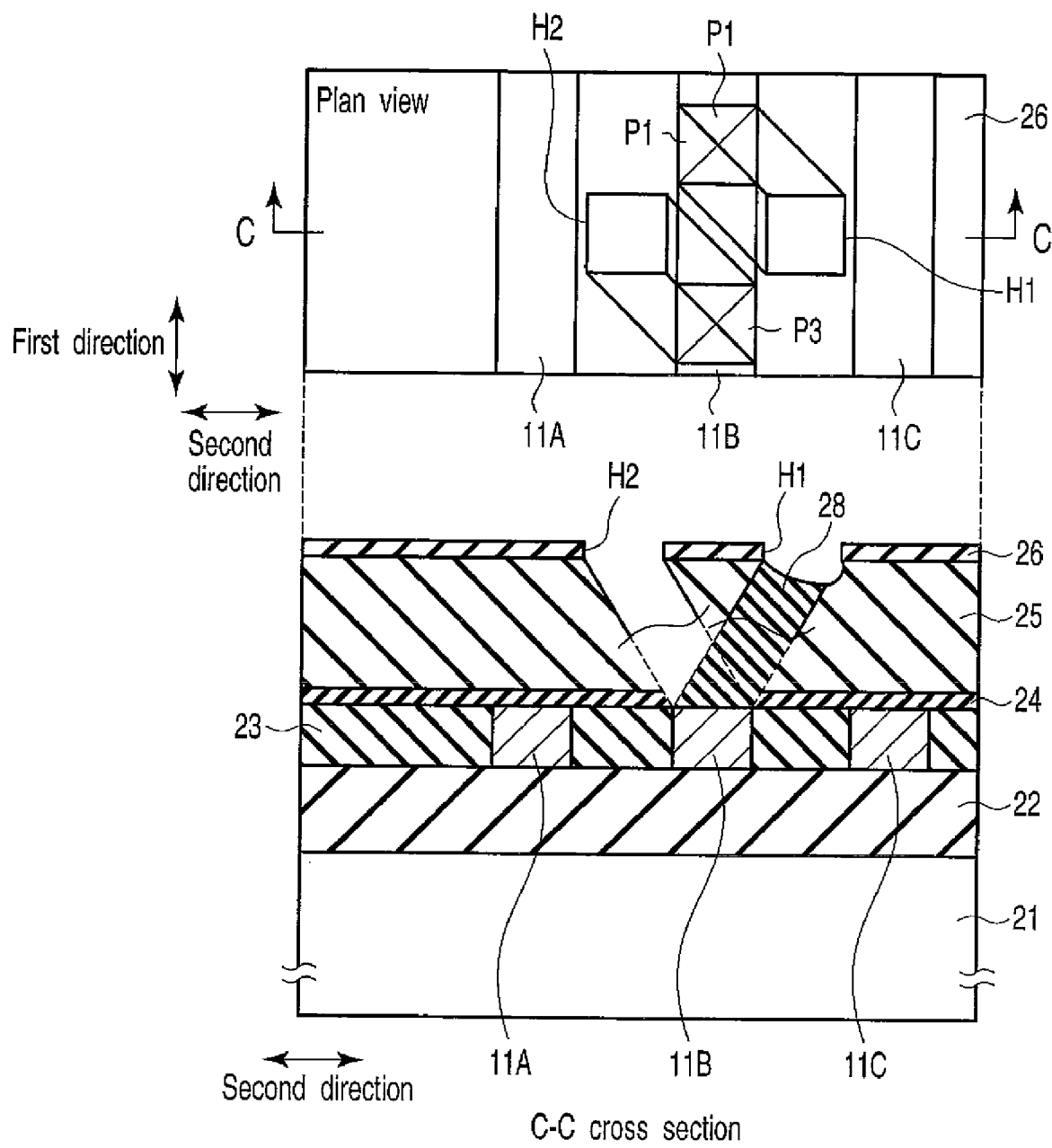
FIG. 20 is a diagram showing a process of the first manufacturing method.

Next, as shown in FIG. 20, the inter-layer insulating layer 25 is etched by RIE using the hard mask 26 as a mask to form a via hole H2 extending in the oblique direction inside the inter-layer insulating layer 25. Here, to form such an oblique via hole H2, the semiconductor substrate (a wafer, for example) 21 may be placed inside a chamber of RIE while the semiconductor substrate 21 is tilted.

However, the way of tilting the semiconductor substrate 21 for forming the via hole H1 and that for forming the via hole H2 are symmetrical to each other.

Accordingly, the oblique via hole H2 reaching the contact part P3 of the lower-side interconnect 11B is formed by performing RIE in a common method.

Figure 21:
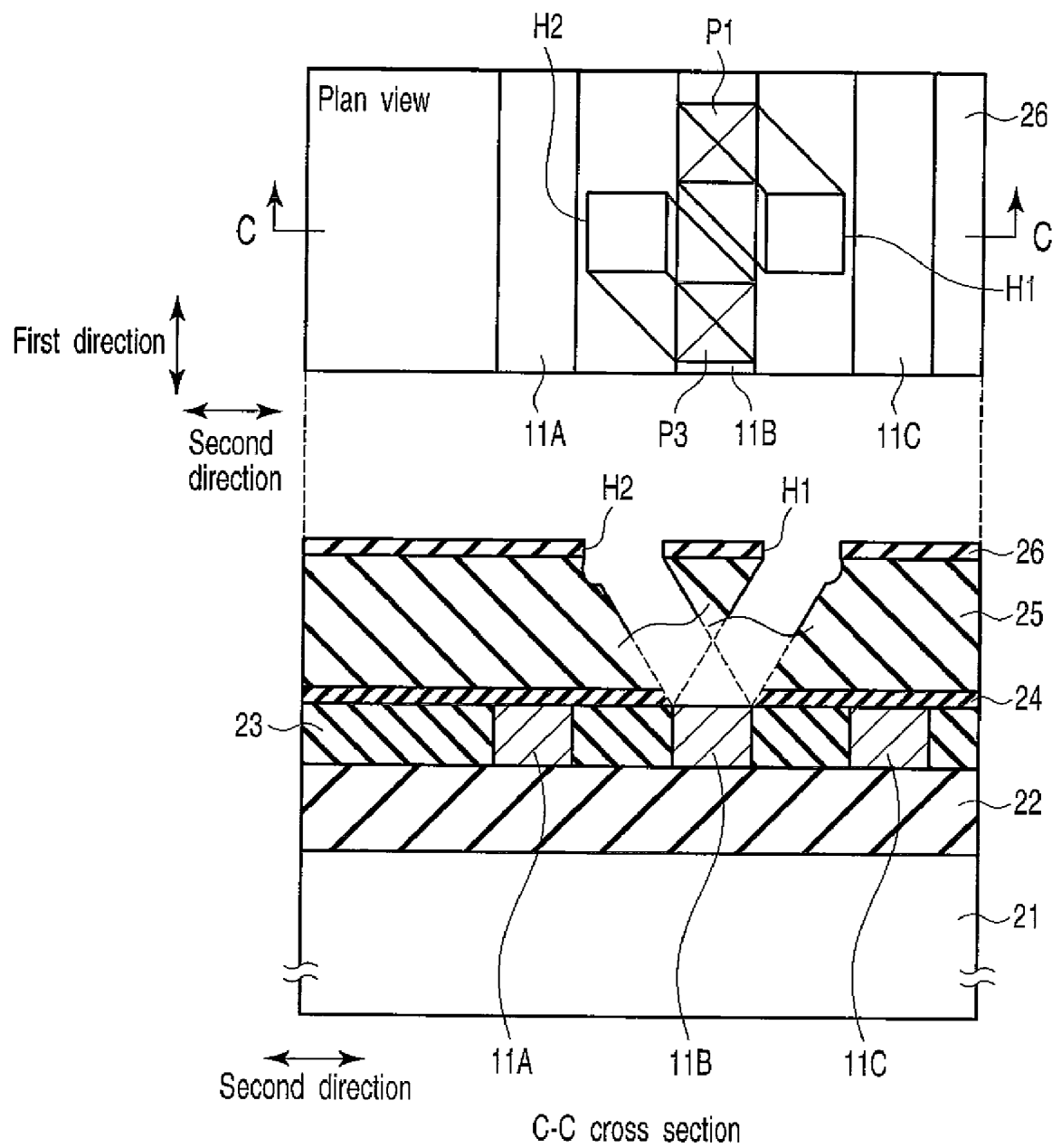
FIG. 21 is a diagram showing a process of the first manufacturing method.

Subsequently, when the protective layer 28 filling the via hole H1 is removed, as shown in FIG. 21, the two via holes H1 and H2 are formed on the lower-side interconnect 11B.

Lastly, as shown in FIG. 22, the via holes H1 and H2 are filled with a conductive material, which is to be the upper-side interconnect 12, to complete the via structure in the first embodiment.

Figure 36:
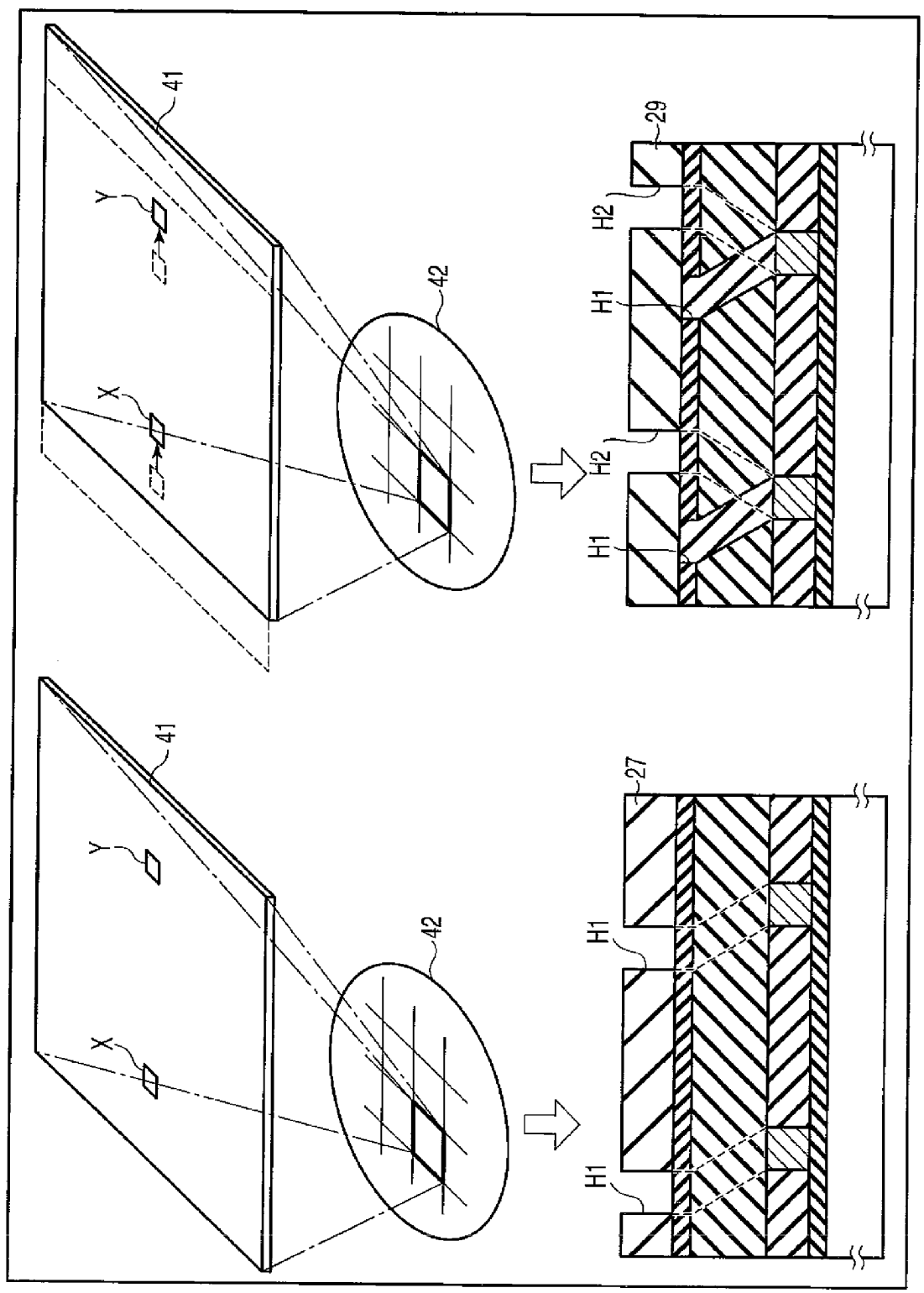
FIG. 36 is a diagram showing a technique to use the same mask in a plurality of steps.

Here, in the above manufacturing method, as shown in FIG. 36, the opening H1 for the photoresist 27 and the opening H2 for the photoresist 29 can be formed using an identical reticle 41.

That is, since the spatial relationship of the two via holes H1 and H2 with respect to the lower-side interconnect 11 is the same for all the lower-side interconnects 11, the openings H1 and H2 can be formed using the identical reticle 41 by slightly shifting the position of the reticle 41 for forming the opening H1 and that for forming the opening H2 while the position of a wafer 42 is fixed.

Therefore, by adopting such a technology, increasing manufacturing costs caused by two vias being provided can be controlled.

(2) SECOND EXAMPLE

FIGS. 23 to 35 show a second example of the manufacturing method. In these diagrams, the upper diagram is a plan view and the lower diagram is a sectional view along the line C-C in the upper diagram.

Figure 23:
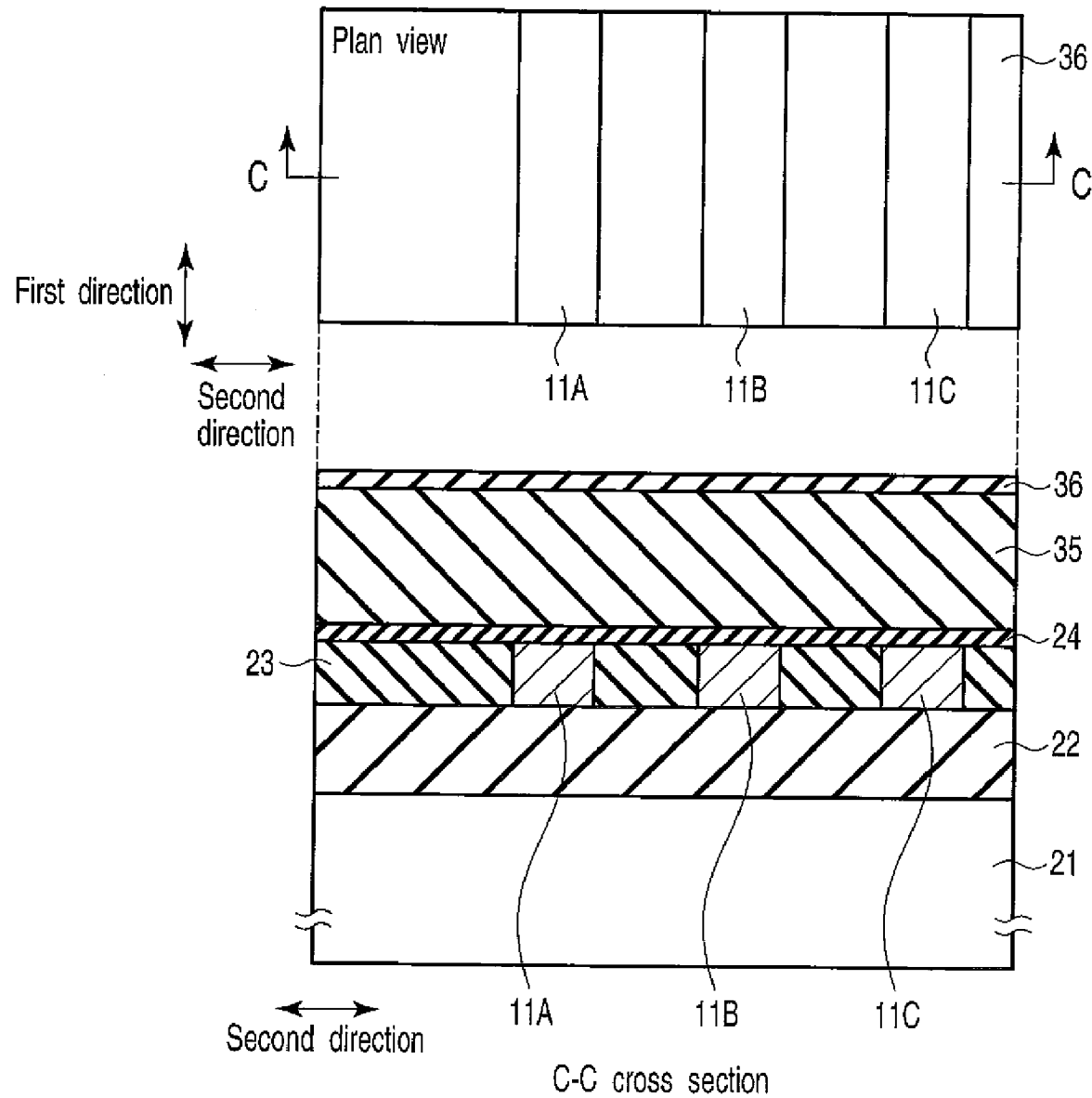
FIG. 23 is a diagram showing a process of a second manufacturing method.

First, as shown in FIG. 23, the insulating layers 22 and 23 are formed on the semiconductor substrate 21 and then grooves extending in the first direction are formed in the insulating layer 23. The grooves after being filled with a conductive material are called lower-side interconnects (lower layer metal) 11A, 11B, and 11C.

The diffusion prevention layer 24 is formed on the lower-side interconnects 11A, 11B, and 11C and the insulating layer 23, and an inter-layer insulating layer 35 is formed on the diffusion prevention layer 24. Further, a hard mask 36 is formed on the inter-layer insulating layer 35.

Here, like the first example, the diffusion prevention layer 24 is formed of material such as SiCN, SiC, and SiN. However, the inter-layer insulating layer 35 is formed of SiOCH and organic materials. The hard mask 36 is formed of material such as SiN, amorphous Si, and SiC.

Next, as shown in FIG. 24, the photoresist 27 having the opening H1 is formed on the hard mask 36 by PEP.

Figure 25:
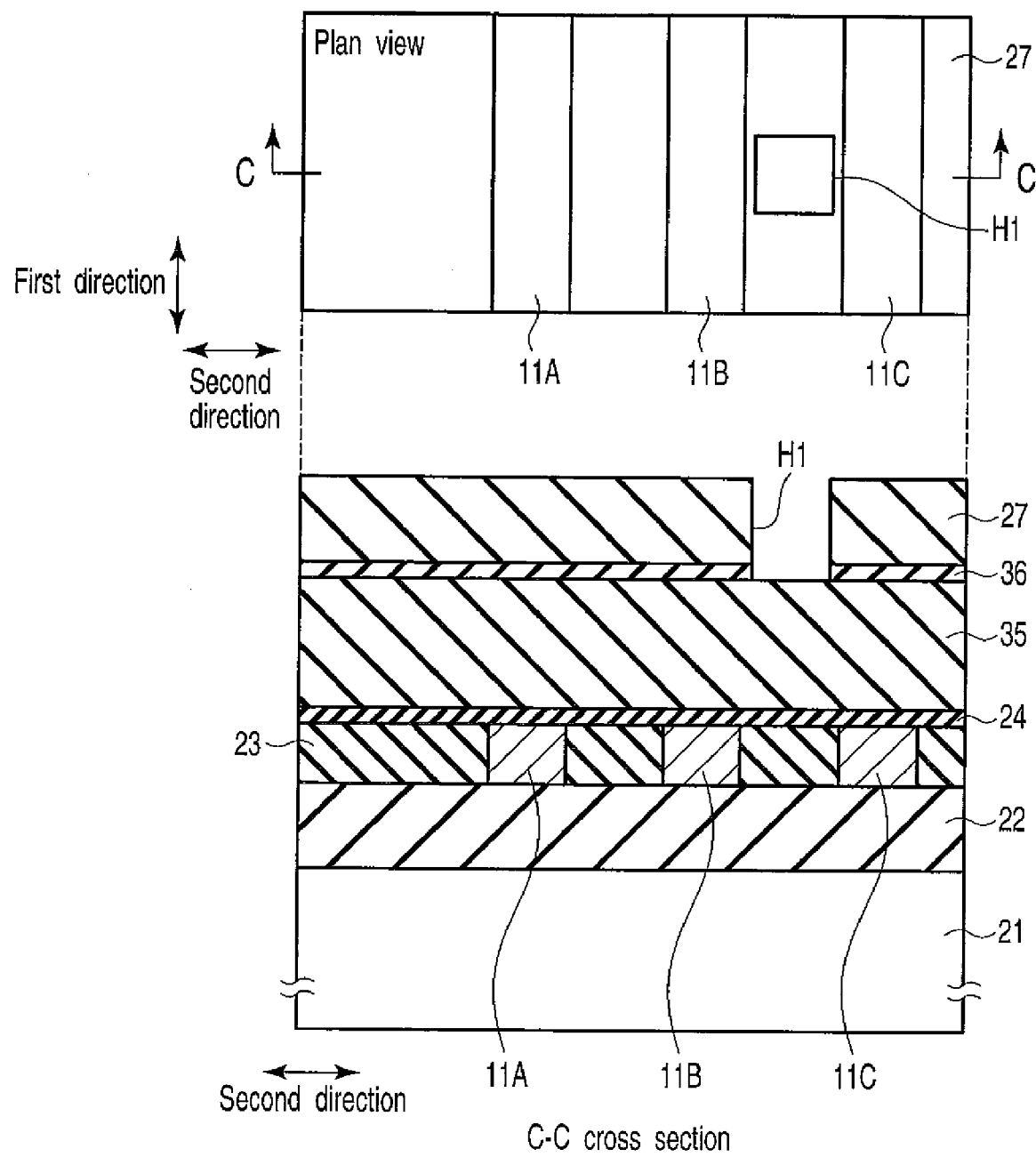
FIG. 25 is a diagram showing a process of the second manufacturing method.
Figure 26:
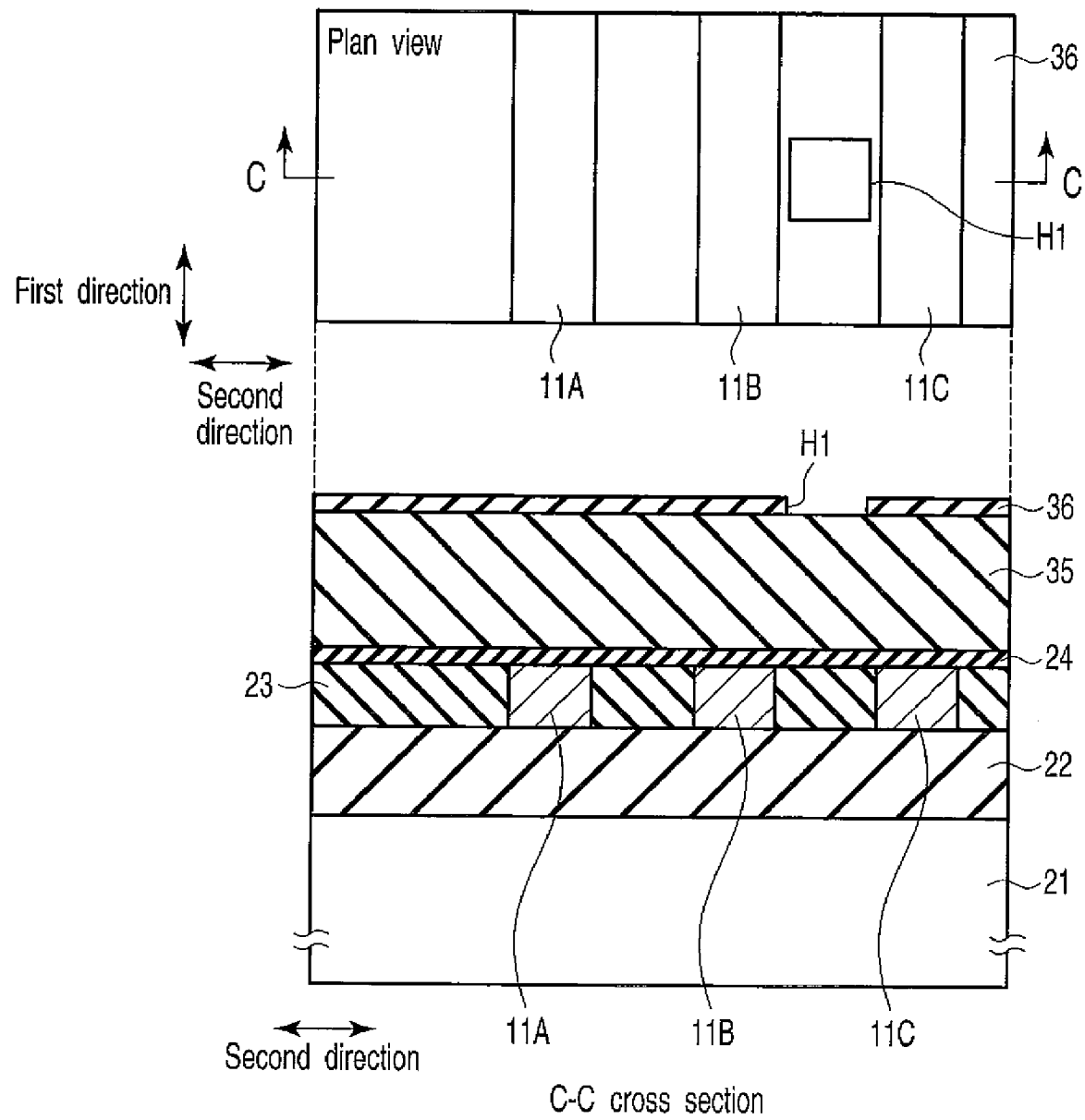
FIG. 26 is a diagram showing a process of the second manufacturing method.

Then, as shown in FIG. 25, the hard mask 36 is etched by RIE using the photoresist 27 as a mask to transfer a pattern of the photoresist 27 to the hard mask 36. Subsequently, the photoresist 27 is separated to form, as shown in FIG. 26, the hard mask 36 having the opening H1.

Figure 27:
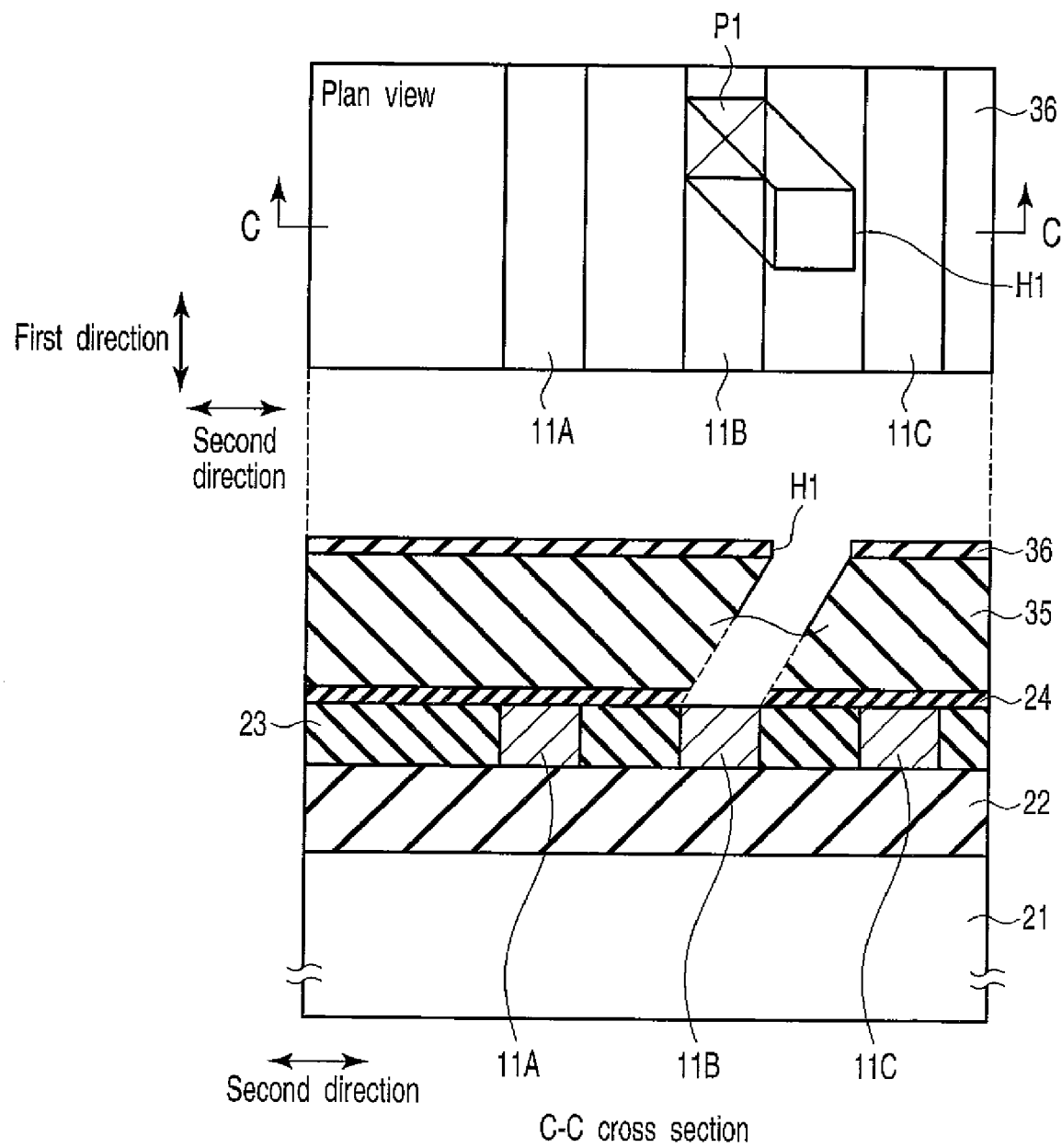
FIG. 27 is a diagram showing a process of the second manufacturing method.

Next, as shown in FIG. 27, the inter-layer insulating layer 35 is etched by RIE using the hard mask 36 as a mask to form a via hole H1 extending in the oblique direction inside the inter-layer insulating layer 35. Here, to form such an oblique via hole H1, like the first example, the semiconductor substrate 21 may be placed inside a chamber of RIE while the semiconductor substrate 21 is tilted.

Accordingly, the oblique via hole H1 reaching the contact part P1 of the lower-side interconnect 11B is formed by performing RIE in a common method.

Figure 28:
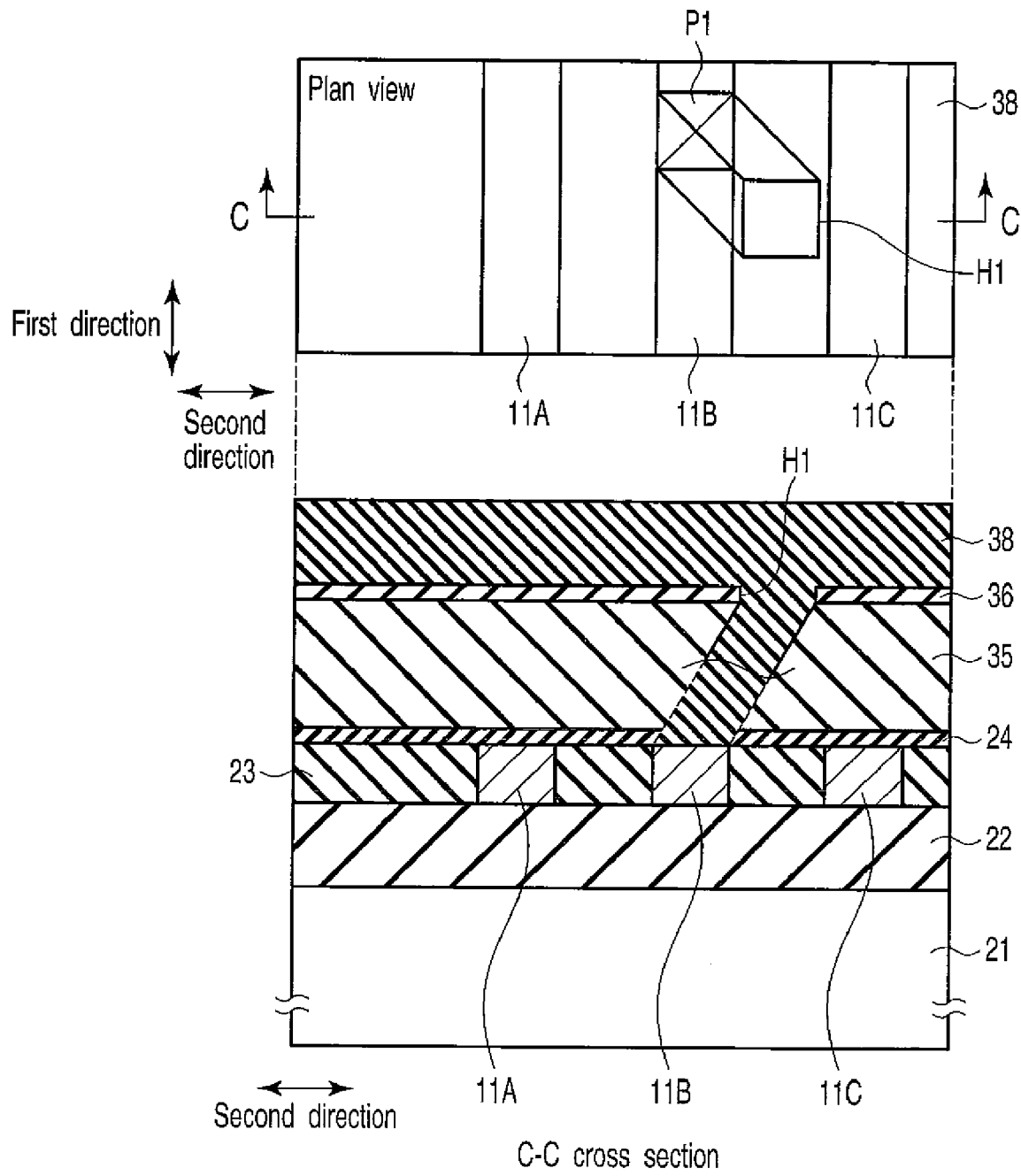
FIG. 28 is a diagram showing a process of the second manufacturing method.

Next, as shown in FIG. 28, the oblique via hole H1 is filled, for example, with a protective layer 38 formed of coated $SiO_2$. The protective layer 38 is preferably formed of material having an etching selection ratio for the inter-layer insulating layer 35.

Figure 29:
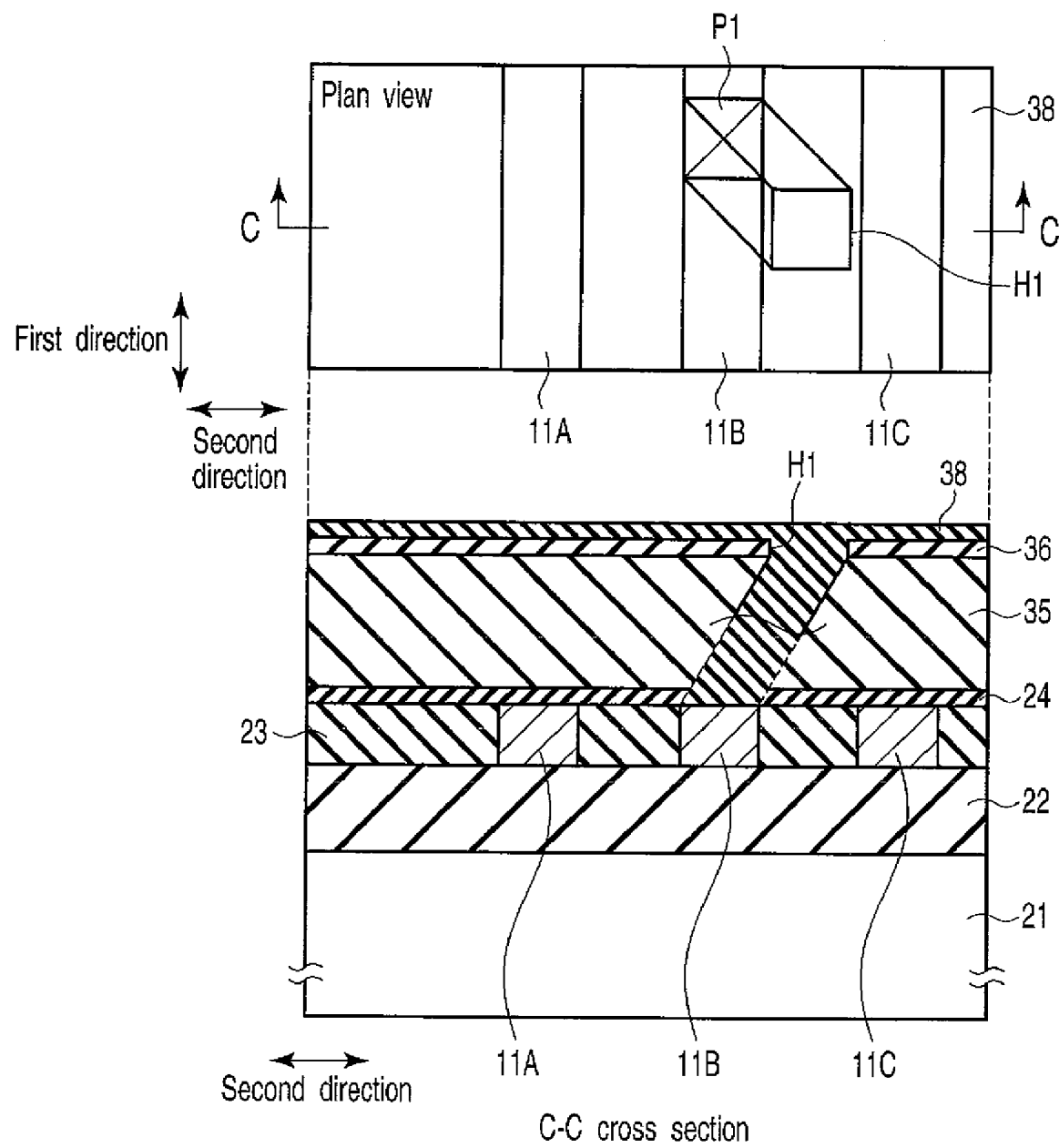
FIG. 29 is a diagram showing a process of the second manufacturing method.

Then, as shown in FIG. 29, the excessive protective layer 38 on the hard mask 36 is removed. However, the protective layer 38 needs to completely fill the via hole H1 and thus, the protective layer 38 is etched so as to leave a thin film thereof on the hard mask 36.

Next, as shown in FIG. 30, the photoresist 29 having the opening H2 is formed by PEP on the protective layer 38.

Figure 32:
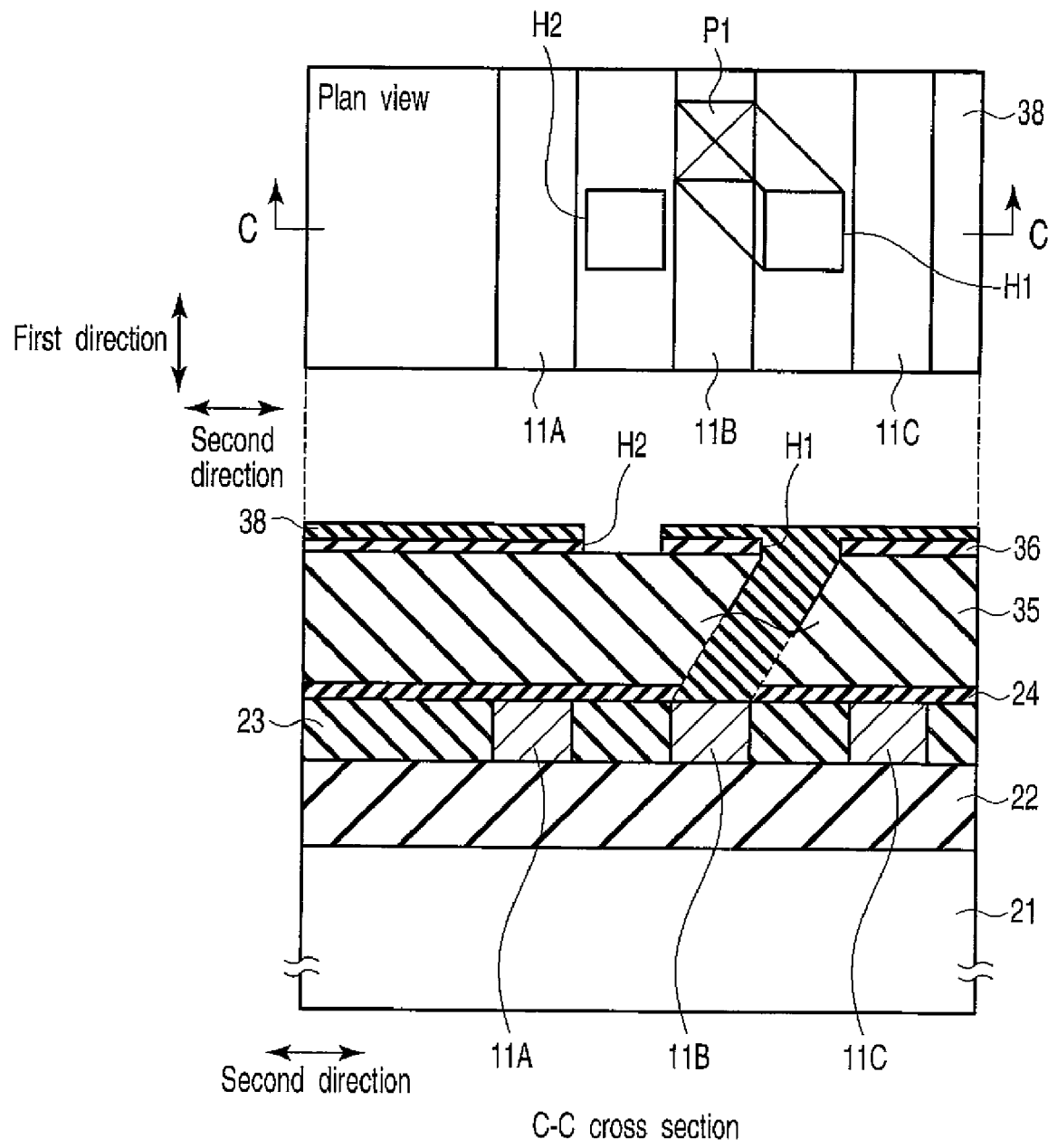
FIG. 32 is a diagram showing a process of the second manufacturing method.

Then, as shown in FIG. 31, the protective layer 38 and the hard mask 36 are etched by RIE using the photoresist 29 as a mask to transfer a pattern of the photoresist 29 to the hard mask 36. Subsequently, the photoresist 29 is separated to form, as shown in FIG. 32, the hard mask 36 having the opening H2.

While in the first example, the protective layer is simultaneously removed at a step of separating the photoresist 29, the protective layer 38 on the hard mask 36 is not removed in the second example.

Figure 33:
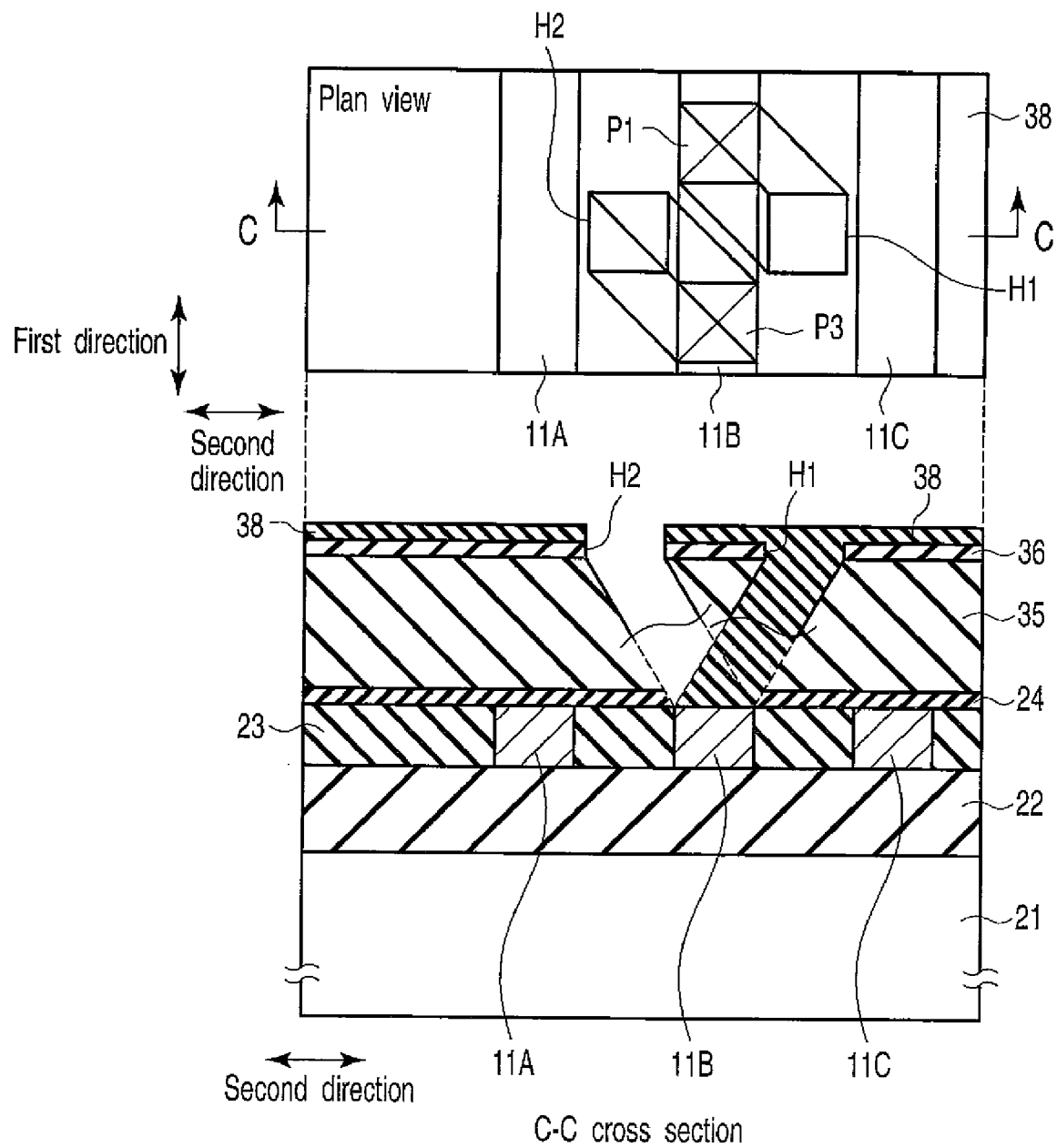
FIG. 33 is a diagram showing a process of the second manufacturing method.

Next, as shown in FIG. 33, the inter-layer insulating layer 35 is etched by RIE using the protective layer 38 and the hard mask 36 as masks to form the via hole H2 extending in the oblique direction inside the inter-layer insulating layer 35. Here, to form such an oblique via hole H2, like the first example, the semiconductor substrate 21 may be placed inside a chamber of RIE while the semiconductor substrate 21 is tilted.

However, the way of tilting the semiconductor substrate 21 for forming the via hole H1 and that for forming the via hole H2 are symmetrical to each other.

Accordingly, the oblique via hole H2 reaching the contact part P3 of the lower-side interconnect 11B is formed by performing RIE in a common method.

Figure 34:
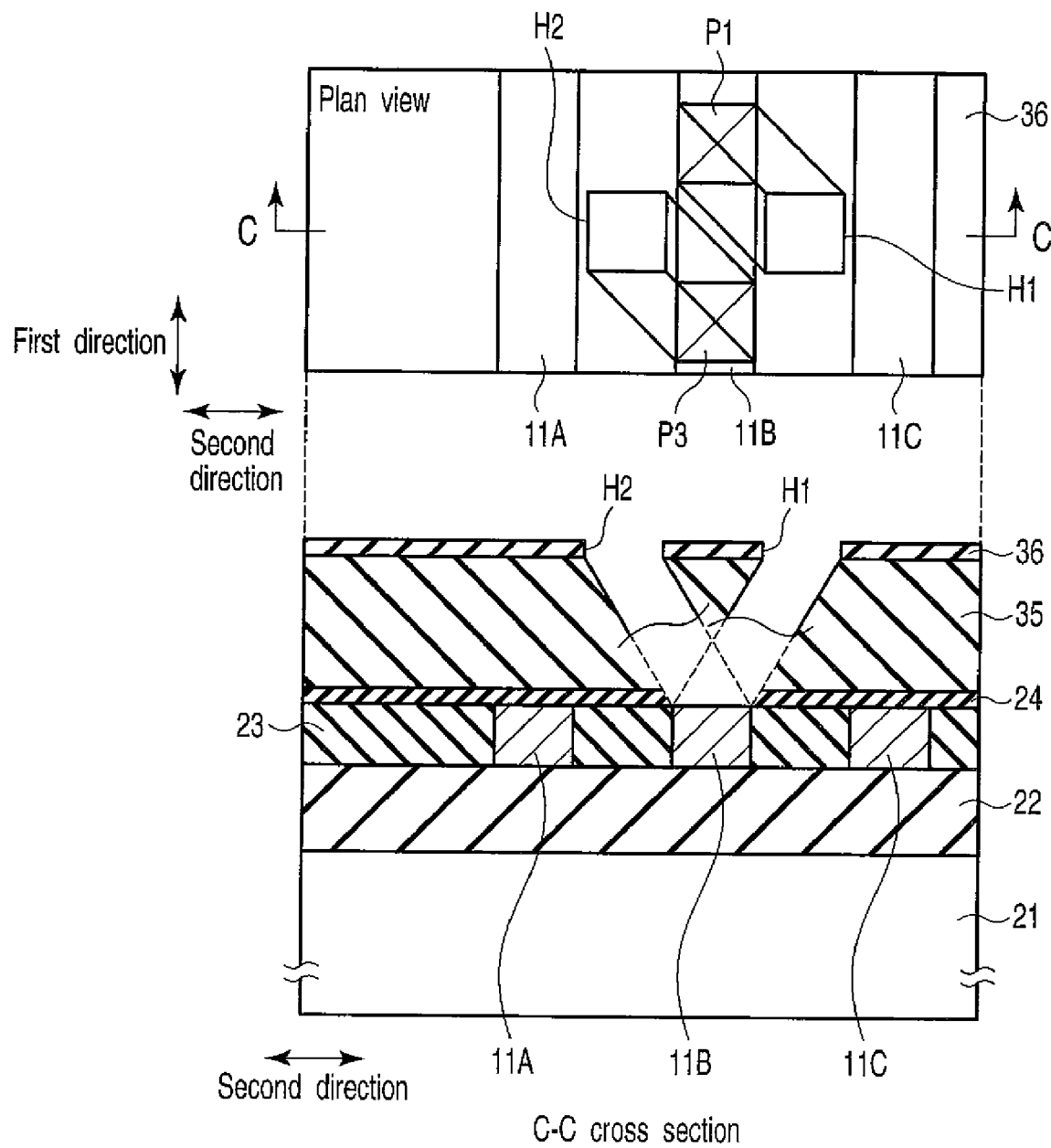
FIG. 34 is a diagram showing a process of the second manufacturing method.

Subsequently, when the protective layer 38 filling the via hole H1 is removed, as shown in FIG. 34, the two via holes H1 and H2 are formed on the lower-side interconnect 11B.

Figure 35:
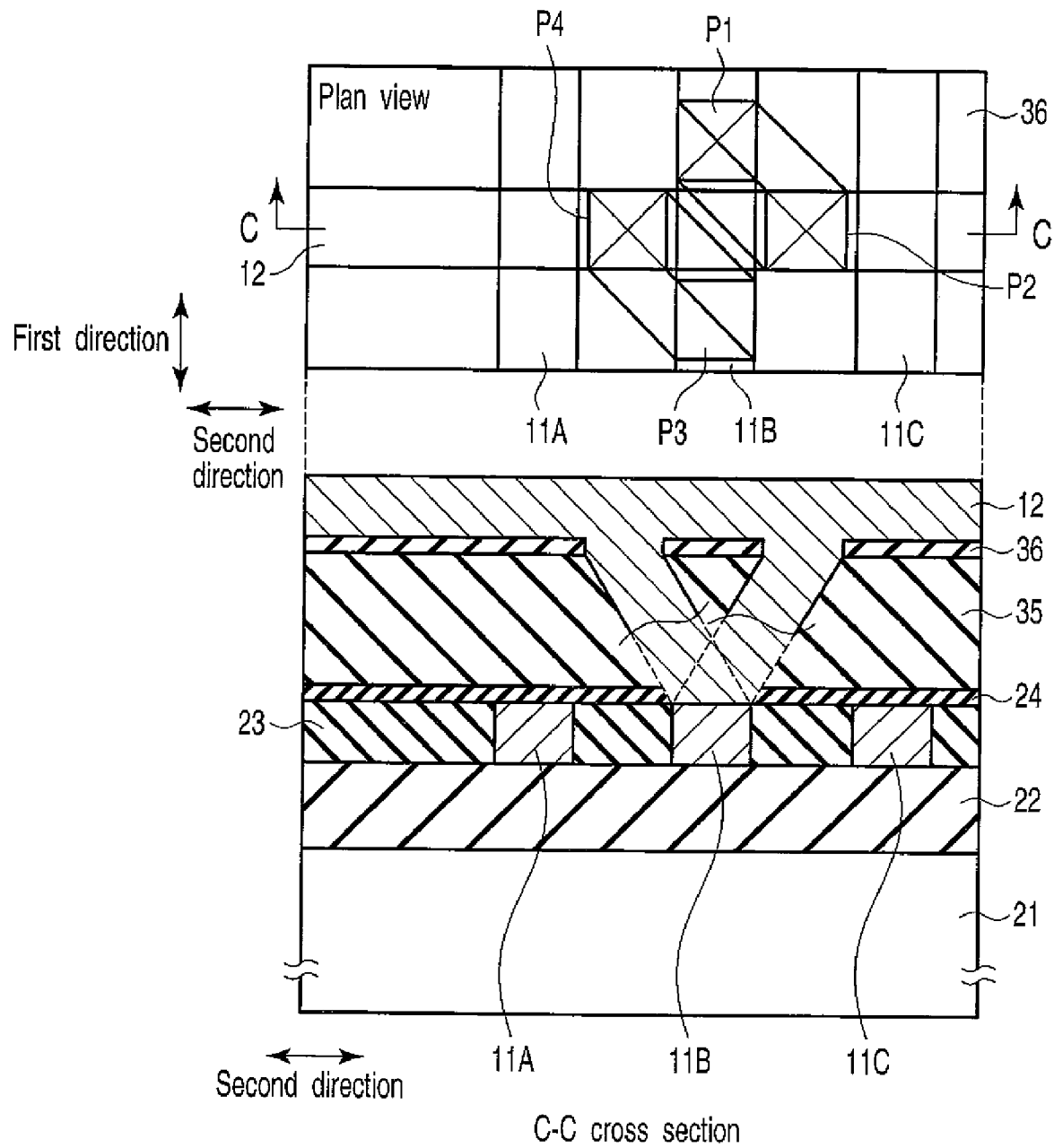
FIG. 35 is a diagram showing a process of the second manufacturing method.

Lastly, as shown in FIG. 35, the via holes H1 and H2 are filled with a conductive material, which is to be the upper-side interconnects 12, to complete the via structure in the first embodiment.

Here, in the above manufacturing method, as shown in FIG. 36, the opening H1 for the photoresist 27 and the opening H2 for the photoresist 29 can be formed using the identical reticle 41.

Therefore, by adopting such a technology, increasing manufacturing costs caused by two vias being provided can be controlled.

5. Application Example

The present invention is applicable to all semiconductor integrated circuits whose interconnect layers are multi-layered.

For example, the present invention is applicable to semiconductor integrated circuits such as microcomputers, system LSI, and memory combined logic LSI.

6. Advantage

According to the present invention, a plurality of vias or an equivalent one can be arranged at an intersection of a lower-side interconnect and an upper-side interconnect without wasting interconnect pathways.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first interconnect extending in a first direction;
   a second interconnect arranged over the first interconnect and extending in a second direction intersecting the first direction;
   a first via for connecting a first contact part of the first interconnect and a second contact part of the second interconnect; and
   a second via for connecting a third contact part of the first interconnect and a fourth contact part of the second interconnect,
   wherein the first and third contact parts are arranged by being aligned in the first direction, and the second and fourth contact parts are arranged by being aligned in the second direction.

2. The semiconductor integrated circuit according to claim 1,
   wherein the first via extends in an oblique direction with respect to an upper surface of the first interconnect or a lower surface of the second interconnect.

3. The semiconductor integrated circuit according to claim 1,
   wherein the second via extends in an oblique direction with respect to an upper surface of the first interconnect or a lower surface of the second interconnect.

4. The semiconductor integrated circuit according to claim 1,
   wherein the first and second vias are partly in contact.

5. The semiconductor integrated circuit according to claim 1,
   wherein the first and third contact parts are in contact.

6. The semiconductor integrated circuit according to claim 1,
   wherein the second and fourth contact parts are in contact.

7. The semiconductor integrated circuit according to claim 1,
   wherein the first interconnect has no protruding portion protruding in the second direction at an intersection of the first and second interconnects.

8. The semiconductor integrated circuit according to claim 1,
   wherein the second interconnect has no protruding portion protruding in the first direction at an intersection of the first and second interconnects.

9. The semiconductor integrated circuit according to claim 1,
   wherein the first and second contact parts are located by being shifted from a center of an intersection of the first and second interconnects.

10. The semiconductor integrated circuit according to claim 1,
    wherein the third and fourth contact parts are located by being shifted from a center of an intersection of the first and second interconnects.

11. A semiconductor integrated circuit comprising:
    a first interconnect extending in a first direction;
    a second interconnect arranged over the first interconnect and extending in a second direction intersecting the first direction; and
    a via for connecting a first contact part of the first interconnect and a second contact part of the second interconnect,
    wherein the via extends in an oblique direction with respect to an upper surface of the first interconnect or a lower surface of the second interconnect.

12. The semiconductor integrated circuit according to claim 11,
    wherein the first and second contact parts are located by being shifted from a center of an intersection of the first and second interconnects.

13. The semiconductor integrated circuit according to claim 11,
    wherein the first interconnect has no protruding portion protruding in the second direction at an intersection of the first and second interconnects.

14. The semiconductor integrated circuit according to claim 11,
    wherein the second interconnect has no protruding portion protruding in the first direction at an intersection of the first and second interconnects.

15. A semiconductor integrated circuit comprising:
    a first interconnect extending in a first direction;
    a second interconnect arranged over the first interconnect and extending in a second direction intersecting the first direction; and
    a via for connecting a first contact part of the first interconnect and a second contact part of the second interconnect,
    wherein a width of the via in the first direction at the first contact part is broader than that of the second interconnect in the first direction and the width of the via in the first direction gradually becomes narrower from the first interconnect toward the second interconnect.

16. The semiconductor integrated circuit according to claim 15,
    wherein the first interconnect has no protruding portion protruding in the second direction at an intersection of the first and second interconnects.

17. The semiconductor integrated circuit according to claim 15,
    wherein the second interconnect has no protruding portion protruding in the first direction at an intersection of the first and second interconnects.

18. A semiconductor integrated circuit comprising:
    a first interconnect extending in a first direction;
    a second interconnect arranged over the first interconnect and extending in a second direction intersecting the first direction; and a via for connecting a first contact part of the first interconnect and a second contact part of the second interconnect, wherein a width of the via in the second direction at the second contact part is broader than that of the first interconnect in the second direction and the width of the via in the second direction gradually becomes narrower from the second interconnect toward the first interconnect.

19. The semiconductor integrated circuit according to claim 18, wherein the first interconnect has no protruding portion protruding in the second direction at an intersection of the first and second interconnects.

20. The semiconductor integrated circuit according to claim 18, wherein the second interconnect has no protruding portion protruding in the first direction at an intersection of the first and second interconnects.

* * * * *